(12) United States Patent
Harms et al.

(10) Patent No.: US 7,319,341 B1
(45) Date of Patent: Jan. 15, 2008

(54) METHOD OF MAINTAINING SIGNAL INTEGRITY ACROSS A CAPACITIVE COUPLED SOLDER BUMP

(75) Inventors: Michael Harms, Pleasanton, CA (US); Eric C. Chang, Cupertino, CA (US); Paul Tracy, Sunnyvale, CA (US); John DiCosola, Pleasanton, CA (US); Mandrita Brahmachari, Milpitas, CA (US)

(73) Assignee: Altera Corporation, San Jose, CA (US)

( * ) Notice: Subject to any disclaimer, the term of this patent is extended or adjusted under 35 U.S.C. 154(b) by 413 days.

(21) Appl. No.: 10/653,045

(22) Filed: Aug. 28, 2003

(51) Int. Cl.
*G01R 31/26* (2006.01)

(52) U.S. Cl. .................................... 324/765

(58) Field of Classification Search ........ 324/754–758, 324/765, 158.1; 438/14–18; 134/6–7, 9
See application file for complete search history.

(56) References Cited

U.S. PATENT DOCUMENTS

| | | | |
|---|---|---|---|
| 5,274,336 A | | 12/1993 | Crook et al. |
| 5,541,524 A | * | 7/1996 | Tuckerman et al. ........ 324/754 |
| 5,597,737 A | * | 1/1997 | Greer et al. .................. 438/17 |
| 5,629,838 A | * | 5/1997 | Knight et al. ................ 361/782 |
| 5,776,551 A | * | 7/1998 | Pasch .................... 257/E21.508 |
| 5,786,073 A | * | 7/1998 | Pasch ........................... 134/1.2 |
| 6,130,104 A | * | 10/2000 | Yamasaka .................... 324/754 |
| 6,162,652 A | * | 12/2000 | Dass et al. ..................... 438/18 |
| 6,166,556 A | * | 12/2000 | Wang et al. ................. 324/765 |
| 6,179,198 B1 | * | 1/2001 | Eifuku et al. .......... 228/180.22 |
| 6,337,577 B1 | * | 1/2002 | Doherty et al. ............. 324/765 |
| 6,456,099 B1 | * | 9/2002 | Eldridge et al. ............ 324/754 |
| 6,535,002 B2 | * | 3/2003 | Haseyama et al. .......... 324/754 |
| 6,759,858 B2 | * | 7/2004 | Roggel ........................ 324/754 |
| 6,825,052 B2 | * | 11/2004 | Eldridge et al. ............ 324/754 |
| 6,860,009 B2 | * | 3/2005 | Gleason et al. ................ 29/874 |
| 6,861,858 B2 | * | 3/2005 | Chen et al. .................. 324/755 |
| 2001/0009061 A1 | * | 7/2001 | Gleason et al. ............... 29/593 |

* cited by examiner

*Primary Examiner*—Jermele Hollington
(74) *Attorney, Agent, or Firm*—Morgan, Lewis & Bockius LLP

(57) ABSTRACT

The present invention is a novel method and computer program product which utilizes an interface capacitor formed by the metal of the probe tip, a dielectric layer, such as an oxide, formed by a contaminant on a solder bump and the metal of the solder bump. The interface capacitor forms a capacitive divider with the inherent capacitances of the automatic test equipment and the device under test (DUT). The voltage characteristics of the capacitive divider are used to drive voltage signals across the interface capacitor to test the DUT. In either direction (i.e. from the automatic test equipment to the DUT or vice versa), by altering the voltage output high amplitude of the driver and/or the voltage input high amplitude of the load, the DUT is validly tested through the interface capacitor. Thus, even if all I/O bumps have an oxide layer, the device may still be validly tested.

45 Claims, 10 Drawing Sheets

METHOD OF MAINTAINING SIGNAL INTEGRITY ACROSS A CAPACITIVE COUPLED SOLDER BUMP

The present invention relates generally to maintaining electrical signal integrity during the testing of integrated circuits, and particularly to the manufacturing testing of flip chip integrated circuits with solder bumps.

BACKGROUND OF THE INVENTION

This invention is especially useful in testing flip-chip devices. As shown in the illustration of a single flip-chip device 102 in FIG. 1A, such flip-chip devices typically have solder bumps 104 on a face of the flip-chip that are the electrical connections to the flip-chip 102. The flip-chip 102 is encapsulated in a larger package 112; and solder bumps 104 are connected via connectors schematically represented by lines 108 through a packaging substrate 106 to larger package solder bumps 110 (e.g. in a Ball Grid Array (BGA) configuration). The package solder bumps 110 are used to connect the entire package to a printed circuit board (PCB) or other electronic device. The solder bumps 104 of the flip-chip 102 are critical to the operation of the flip-chip device, as they provide the electrical connections into and out of the flip-chip.

Integrated chip devices may include Boundary Scan Testing (BST) architecture in accordance with IEEE Standard 1149.1 developed by the Joint Test Action Group (JTAG). BST architecture offers the capability to efficiently test components on printed circuit boards with tight lead spacing. Pin connections on a device can be tested and functional data captured using the BST architecture with or without physical test probes. BST architecture adds four or five test pins to the device and embeds test circuitry at chip level to provide access to chip assemblies for testing, debugging and in-system device programming. As illustrated in FIG. 1B, boundary scan cells 126 are connected to solder bumps 124 and the core logic 122 of the device via connectors 128 and 132, respectively. Additionally, boundary scan cells 126 are connected in series to each other via connectors (e.g., 130 and 138). Boundary scan cells can force signals onto and capture signals from device solder bumps 124 or core logic 122. Test data is serially shifted into the boundary scan cells 126 associated with each device solder bump through a Test Data Input (TDI) pin 134 on the device. Captured test data is serially shifted out of boundary scan cells 126 through a Test Data Output (TDO) pin 136. The captured test data is then compared with expected results to determine errors in the device. Although solder bumps 124 are shown on the sides of the integrated circuit device 120 for ease of illustration, typically the solder bumps will be on top of the integrated circuit device 120 (i.e. on the surface of the device coming out of the plane of the page in FIG. 1B; e.g., see the side view shown in FIG. 1A).

Before they are incorporated into a larger electronic device, semiconductor electronic devices are usually tested using Automatic Testing Equipment (ATE) systems. These systems include a tester and a prober with a test head and probe card assembly acting as the interface between the tester and device under test (DUT). The P-8 or P-12 systems manufactured by Tokyo Electron Limited (TEL) of Tokyo, Japan, are examples of prober systems. In the illustrative system shown in FIG. 2, a tester 202 includes a tester computer 206 and a tester controller 208 with various electronics and drivers to provide power and test signals to DUTs. The tester controller 208 includes electronics for controlling and operating the tester and interface card. An independent voltage source (not shown) may also be included in the tester controller electronics. A test head 212, a probe card 214 and probe card contacts 216 are connected by appropriate cabling 210 to the tester controller 208. The tester computer 206 includes at least a central processing unit (CPU), a user or system operator interface, a system memory for storing data and software programs and buses for connecting the various parts of the system. The memory can store programs for signaling the tester controller 208 to apply various electrical signals for testing devices. Test programs typically include test vectors that have a test data stream and a corresponding expected device response data stream for the DUT.

A prober 204 includes a test head/probe card holder (not shown) and a prober controller 220 for controlling the movement of a wafer chuck 226 in which a wafer 228 is mounted. The prober 204 has a prober computer 218 connected to the prober controller 220. In combination, the prober computer 218 and the prober controller 220 direct the movement of a wafer table 222, as described below. The prober computer 218 includes at least a central processing unit (CPU), a user or system operator interface and a system memory for storing data and software programs. The memory stores programs for signaling the prober controller 220 to apply various electrical signals for operating the wafer table 222 to move device wafers into contact with the probe card contacts 216. Both the prober computer 218 and the tester computer 206 may be programmed separately or in conjunction with each other with software program modules designed to operate the prober and tester systems.

The wafer table 222 includes a mechanism 224 for moving the wafer chuck 226 in three dimensions (shown in FIG. 2 by the heavy two-way arrows at 230) to bring a wafer 228 into precise contact with the probe card contacts 216 of the tester 202. The wafer 228 usually includes a two-dimensional array of a plurality of integrated circuit devices (or chips) on its surface. Illustratively, these devices are flip-chip devices such as flip-chip 102 shown in FIG. 1 that have solder bumps on one side of the device. The probe controller 220 controls the movement of the wafer chuck 226, and thereby the location and movement of one or more flip-chips being tested. Through the prober computer 218, the probe controller 220 provides position information to the tester computer 206 via connection 232 so that the test computer can match test signals and response data to the one or more specific devices being tested. Connection 232 is typically a RS232, GPIB, USB, serial port or parallel port connection.

Communications between the tester 202 and prober 204 are carried by connection 232 and typically take the following form. The tester computer 206 includes a test program that sends a signal to the prober computer 218 to move a specific die under the probe card contacts 216 for testing. Following practice in the industry, we refer hereafter to this die as the device under test (DUT). The prober computer 218 includes program modules for receiving the signals from the tester computer 206 and translating the signals into device coordinates on the wafer. The prober controller 220 then moves the DUT horizontally under the probe card contacts 216, and then moves the wafer chuck 226 vertically so that the DUT comes into contact with the probe card contacts 216. Contact here may be actual physical contact, or it may be that a pre-set vertical distance is specified in the prober computer program such that once the wafer chuck is raised that distance the prober controller considers itself to be in contact for the next steps. Further, an overdrive distance may be programmed in the prober computer 218 or provided to the prober computer by the tester computer 206 in order to raise the wafer chuck 226 a further distance beyond initial contact. The overdrive distance compresses some or all of the solder bumps on the DUT and some or all of the probe card contacts, which typically have a spring element. The prober computer 218 then signals the tester computer 206 that the DUT is in contact and may be tested. The test program in the tester computer 206 then signals the tester controller 208 to drive test signals and power through the test head 212 and probe card contacts 216 into the DUT. The DUT's response is received back through the probe card contacts 216, is captured by the tester controller 208, and compared by the tester computer 206 to expected results to determine errors in the DUT. Alternatively, for devices that have BST architecture, in one testing mode test signals are provided through the TDI pin to the boundary scan cells; and the test signals are then driven out of the DUT to the probe card contacts. In a second testing mode, test signals are applied to the DUT through the probe card contacts and are received by the boundary scan cells. These signals may then be read out of the DUT through the TDO pin. With or without BST architecture, an error is found when the actual response signals from the DUT do not match the expected signals. Once the test is completed, the tester computer 206 signals the prober computer 218 that the test is completed and that another device should be moved into contact with the probe card contacts 216 for testing.

Several different types of probe card contacts are known in the art, such as the Vertical Spring Card (VSC), the COBRA-type vertical probe, cantilever needle and the form factor spring. The type primarily referred to throughout this application is a flat tipped vertical probe card contact, such as in VSC or COBRA-type vertical probe systems. A standard flat tipped vertical probe card contact is cylindrical with a flat bottom face used to contact the test site. Such flat tipped contacts apply a downward normal force to the top of a solder bump when the wafer is brought upward into contact with the vertical probe card contacts by the wafer prober.

Regardless of the type of probe contact employed, electrical contact between the contacts on the probe card and the contacts on the DUT is essential for a valid test. In other words, if signals cannot effectively get from the tester into the DUT circuit and vice versa, there is no way to test or even use the DUT. A significant problem in this regard is the formation or collection of resistive and capacitive substances, such as oxides, on the surface of the electrical contacts of the DUT. For example, in flip-chip devices, an oxide formed on the solder bump introduces capacitance and resistance between the DUT's solder bump and the probe card contact. Such oxides are usually formed due to the exposure of the solder bumps to air. If the oxide raises the capacitance and resistivity high enough, no current will pass through the oxide and the DUT will fail the test. Alternatively, the capacitance and resistivity may reduce the speed and/or amplitude of the electrical signals being passed to the DUT to such an extent that a voltage high signal (e.g. a digital "1") may appear as a voltage low signal (e.g. a digital "0") on the device side of the oxide. Further, at-speed testing of a device's functions requires testing the device at or near normal operating speeds (i.e. typically up to about 200 MHz). An added capacitance and resistance may slow the transmission of signals to and from the device such that the device will not function at a 200 MHz speed. An oxide may cause false negatives in the testing of DUTs, and it may require that the tests be repeated. Testing devices is a time consuming and expensive activity, and requiring multiple tests only increases the time and expense. Additionally, the probe card contacts have a limited life, and multiple tests on each wafer will degrade the probe contacts that much faster.

Several techniques have been employed to address this problem. Such efforts have included repetitive touchdowns, keeping the wafer stored in an inert atmosphere cleaning the wafer probes and solder bumps. These add to the testing time and cost, and may not solve the problem in any case for all solder bumps on a given DUT, especially as solder bump sizes and densities continue to decrease along with DUT voltage and current tolerances. Additionally, various probe card contact configurations have been tried, such as the cantilever needle and form factor spring contact assemblies, to employ mechanical means for overcoming the resistance on contacts. However, such mechanical means have various significant drawbacks, as well. For instance, such mechanical means are often restricted in the depth of the array of solder bumps that can be probed. Additionally, these mechanical means tend to leave an indentation in the surface of a solder bump, which raises reliability concerns because of trapping contaminants in the indentation or creating voids in the joint that this solder bump forms with the package substrate.

Thus, none of the aforementioned techniques consistently provide good electrical contact and signal integrity between the DUT and automatic test equipment for all solder bump surfaces; and a need remains for an improved means for making electrical contact and ensuring signal integrity between probe card contacts and solder bumps.

SUMMARY OF THE INVENTION

The present invention addresses the aforementioned problems by utilizing an interface capacitor formed by the metal of the probe tip, a dielectric layer, such as an oxide, on a solder bump and the metal of the solder bump. With the capacitance inherent in the automatic test equipment and in the device under test (DUT), the interface capacitor forms a capacitive divider, and the voltage characteristics of the capacitive divider are used to drive voltage signals across the interface capacitor to test the DUT. In either direction (i.e. from the automatic test equipment to the DUT or vice versa), by altering the voltage output high amplitude of the driver, the voltage input high amplitude of the load and/or the capacitance of the interface capacitor, the DUT is validly tested through the interface capacitor. Thus, even if all I/O bumps have an oxide layer, the device may still be validly tested.

Any oxide or other insulator on the surface of a DUT's solder bumps will typically cease to be a problem for future users once the DUT is soldered into an electronic device. The process of soldering the DUT into the electronic device will displace or destroy the insulator, thereby allowing a non-capacitive connection to the DUT. Thus, if the DUT and ATE can be configured as described above such that the device can be functionally tested across any existing interface capacitors, a user can be confident that the DUT will function properly at normal operating voltages once it is soldered into an electronic device.

The present invention includes a process of testing an electronic device by moving the device in a first direction such that physical contact is made between one or more of the solder bumps on the device and one or more of the metal probe card contacts coupled to the test system. Typically, even after other cleaning techniques are applied, a subset of the solder bumps include a dielectric layer covering a portion of a surface of the solder bumps such that a capacitor is formed at the interface between the metal probe card contact, the dielectric layer and the solder bumps within the subset. Using the capacitive characteristics of the interface capacitor, the device is tested. This process may further include applying an initial voltage signal across the interface capacitor to test the device, capturing a voltage response from the device, and comparing the voltage response to an expected response. If the voltage response does not match the expected response, then one or more voltage parameters in a testing system coupled to the probe card contacts may be adjusted. The one or more voltage parameters are adjusted to pre-determined limits until the voltage response matches the expected response, or else the device fails the test. The device being tested will typically have an input buffer and an output buffer, the input buffer having a voltage input high parameter and the output buffer having a voltage output high parameter. The voltage output high parameters of the device and/or the automatic test equipment and the voltage input high parameters of the device and/or the automatic test equipment may be altered in order to optimize the voltage parameters for testing the device.

Another embodiment of the present invention is a computer program product for use in conjunction with a computer system coupled to an automatic test system for testing integrated circuits. The computer program product includes a computer readable storage medium and a computer program mechanism embedded therein for controlling the automatic tester system. The computer program mechanism includes instructions to move the device in a first direction such that physical contact is made between one or more of the solder bumps on the device and one or more of the metal probe card contacts coupled to the automatic tester. Using the capacitive characteristics of the interface capacitor, various instructions test the device by sending voltage signals across the capacitor.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENTS

Figure 1A:
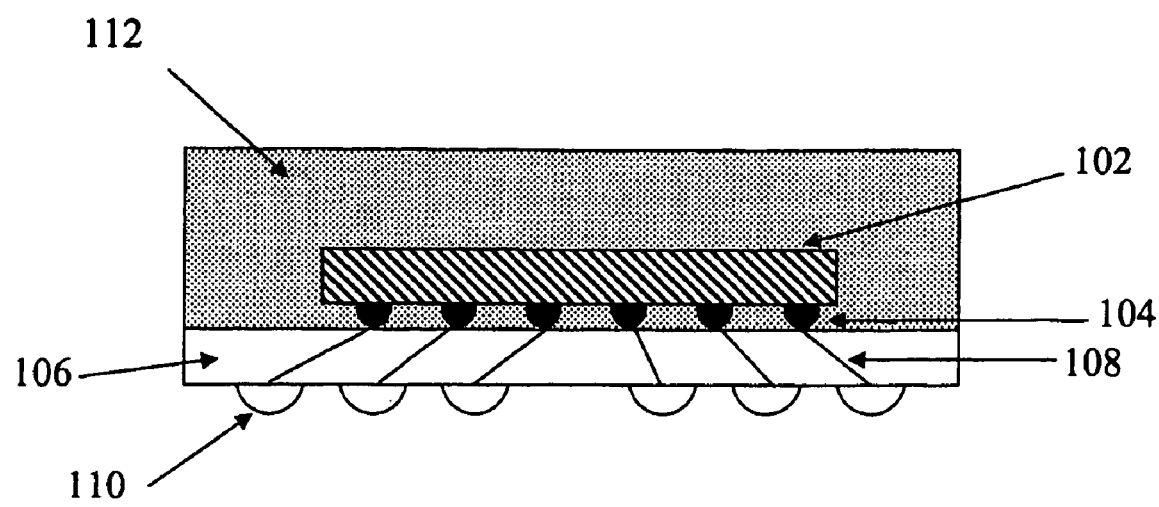
FIG. 1A is a cross-sectional view of a flip-chip semiconductor device.
Figure 1B:
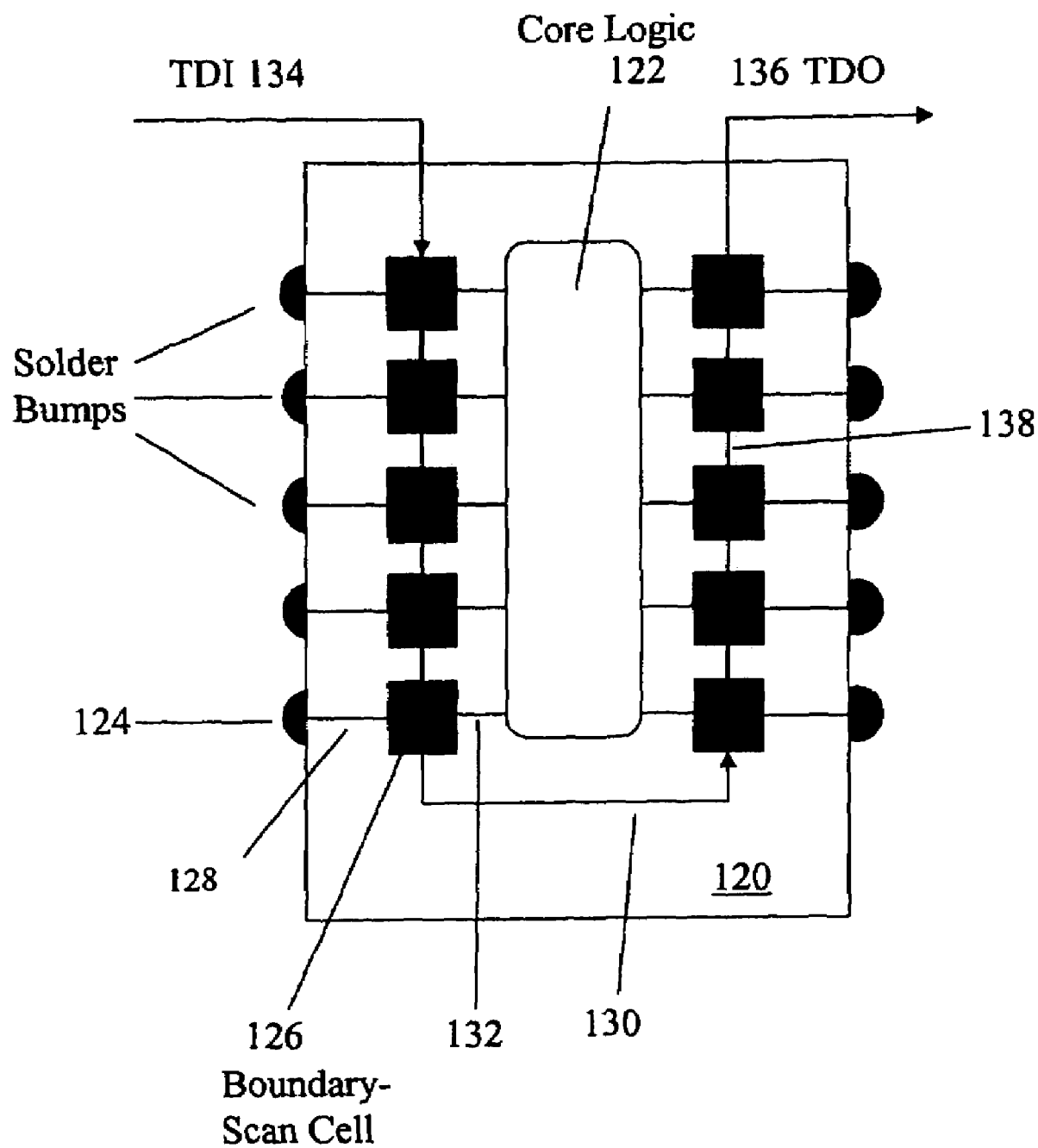
FIG. 1B is a top view of a semiconductor device including Boundary Scan Technology (BST) architecture.

The present invention includes a method and computer program product for overcoming the negative effects of contaminants, such as oxides and other dielectrics, that build up on the surface of solder bumps on microelectronic and semiconductor devices. Specifically, the methods and computer program products described below utilize the capacitance added by these contaminants to test flip-chip type semiconductor devices.

The basic configuration of solder bumps should be noted. Solder bumps as described herein are substantially spherical, although other shapes may be used. The diameters of most solder bumps on flip chip type devices are in the range of 2-5 mils (or 50.8 µm-127 µm, as 1 mil=25.4 micrometers (vm)), although larger or smaller solder bumps may also be employed. As an example, the dimensions of a standard solder bump are 5 mil (127 µm) in diameter and about 4.5 mils (114 µm) high. As is evident in this example, the solder bump is not a complete sphere. In the industry currently, solder bumps regularly range down to about 3 mils (76 µm) in diameter. The size of the probe tip is usually chosen to correspond to the solder bump dimensions. Thus, the probe tip cross-section on a flat-tipped vertical probe contact is scaled down in proportion to the solder bump size. For example, a 4 mil diameter (102 µm) flat-tipped probe diameter is used for probing a 5 mil (127 µm) diameter solder bump is, and a 3 mil (76 µm) diameter flat-tipped probe is used for 4 mil (102 µm) diameter bumps. Probes having a 2 mil (5 µm) diameter tip may be used for 3 mil (76 µm) diameter and smaller bumps.

There are primarily two categories of solder bumps—reflowed and un-reflowed. Reflowed means the bump material has been subjected to a high temperature that has reflowed the material into a bump shape before probe testing first by melting the material to a liquid state and then allowing it to cool. Un-reflowed means that before probe testing the material has not been exposed to a high temperature that causes the material to reflow into a liquid stage. Materials for bumps include: gold, copper, 63/37 eutectic solder, 95/5 high lead solder, and such solder alloys as lead free solder. As an example of the impact the type of solder bump may have on the present invention, take the case of unreflowed 95/5 high lead solder. After the solder bumps are probed by, for example, cantilever needle probes, the marks or deformations that are left on the solder bump will stay on the bump for the rest of the die's life. When the die is attached by these solder bumps to the package substrate, the bumps will not reflow or be re-formed during the attach process. Thus, an indentation and any contaminant collected therein on the surface of the solder bump will be between the chip and the package, negatively impacting the operation of the chip. As an alternative example, 63/37 eutectic solder will reflow during the process of attaching the chip to the package substrate. Thus, any marks that are made on this type of solder bump during probe testing are not as critical, as the entire bump will go into a liquid state and reform during the attach process.

It should be noted that there are two general types of bumps that are probed on any die. The first type is an input/output (I/O) bump through which input or output signals are provided to the die, and the second is a power/ground bump through which power or ground connections are provided to the die. Power and ground bumps are physically separate bumps, but with similar characteristics.

Figure 2:
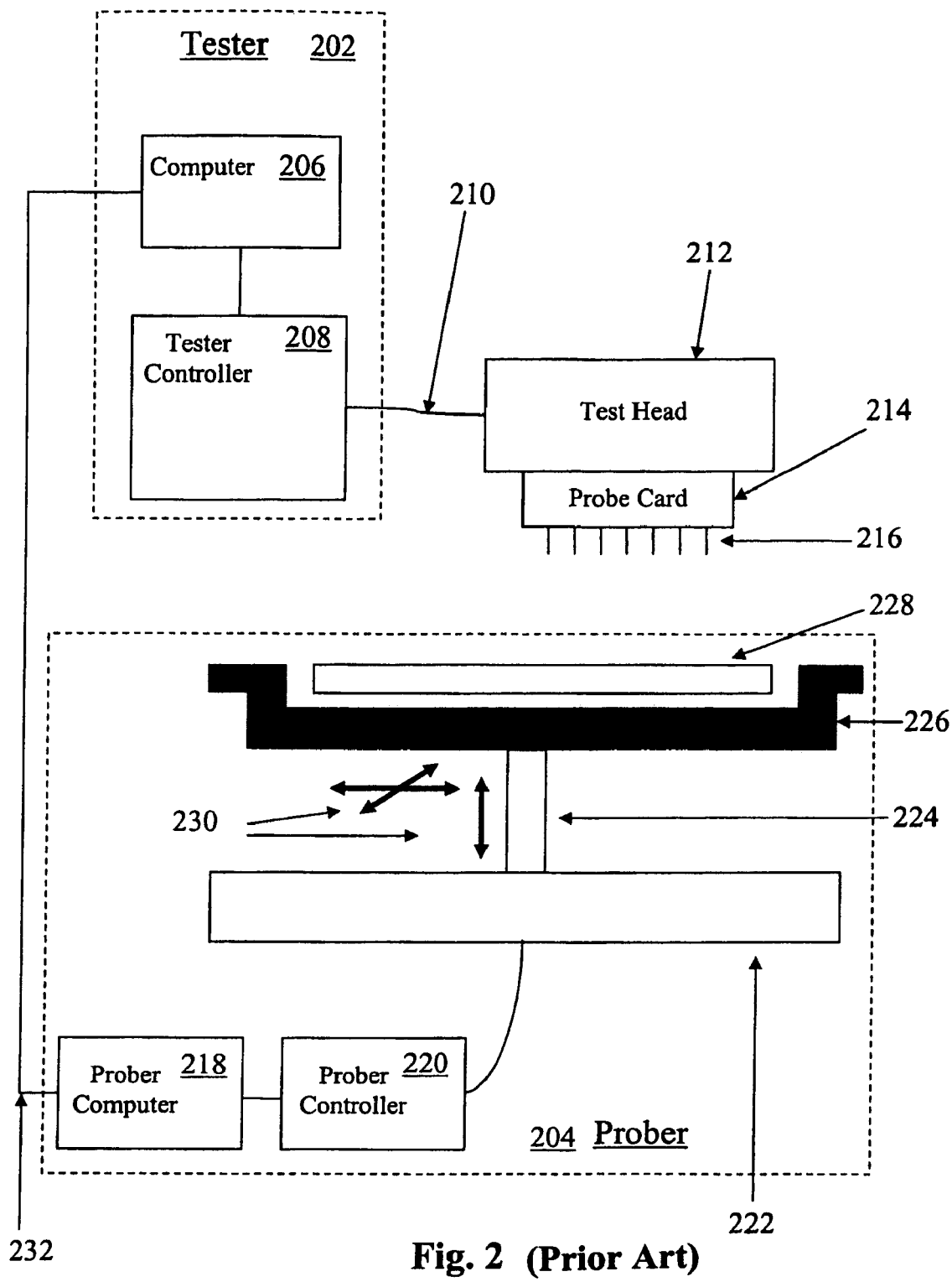
FIG. 2 is a schematic representation of a probe card tester and a prober system.
Figure 3:
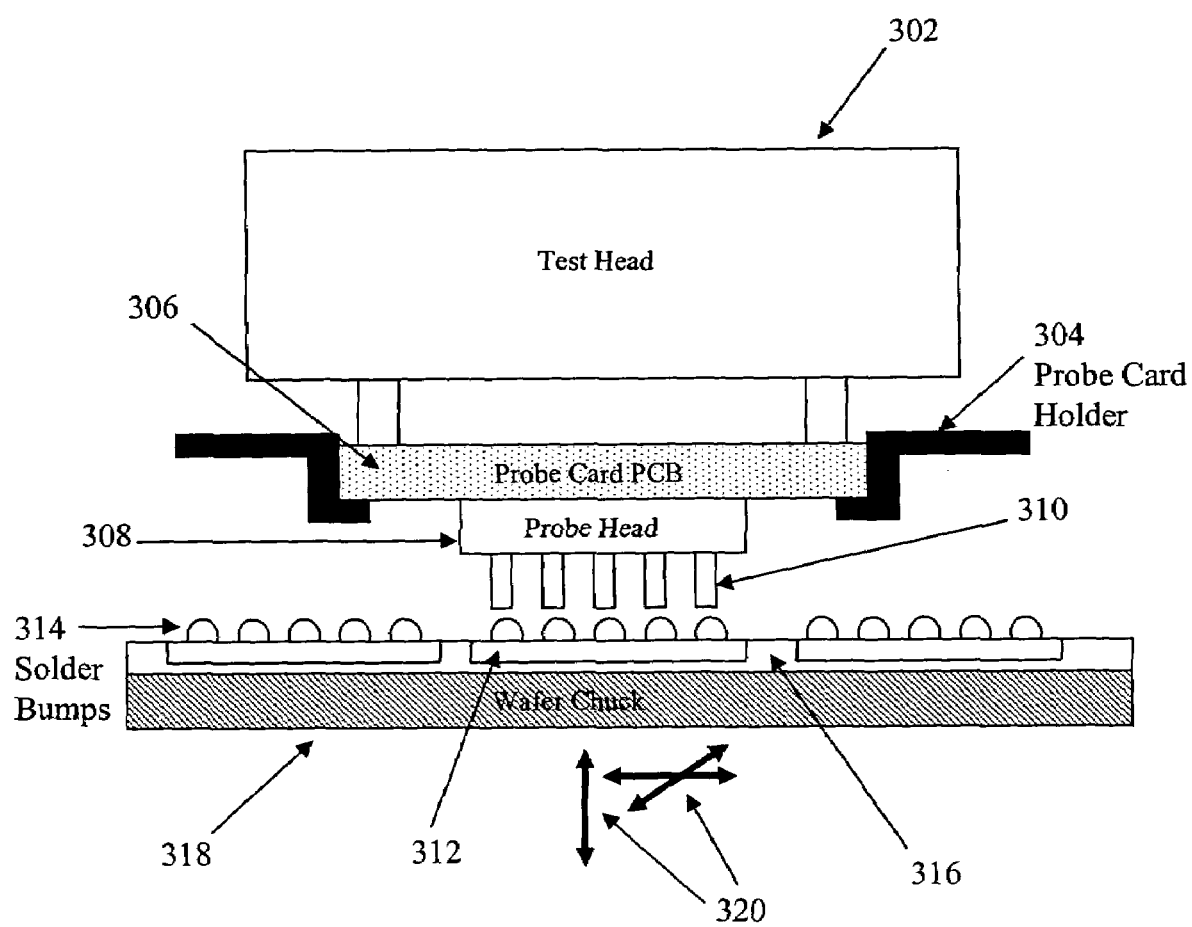
FIG. 3 is a side view of a vertical probe card test head and wafer chuck used for testing integrated circuit devices.

FIG. 3 shows a more detailed view of the test head and wafer chuck of the illustrative prober-tester system shown more generally in FIG. 2. A probe card printed circuit board (PCB) 306 is electrically coupled to a probe head 308. The probe head is coupled to a number of probe contacts 310. The probe contacts 310 are flat-tipped vertical probe contacts which generally have a cylindrical shape with a substantially flat bottom surface. The probe card PCB 306, probe head 308 and probe contacts are held in a test head 302, which in turn is held stationary by a probe card holder 304. Probe card holder 304 is part of the prober system (not shown in FIG. 3). The test head 302 is coupled to the rest of the tester system (not shown), which includes the tester computer and electronics. A wafer 316 being tested has a number of chip devices 312 on it. These devices have solder bumps 314 for making electrical contacts. Following industry practice, each device 312 is referred to as a device under test (DUT). The wafer is carried on a wafer chuck 318 that is moved by the prober system (not shown here). Generally, the probe contact layout is matched to the pattern of the solder bumps on the DUTs. However, for various reasons, it may not be necessary to test every solder bump or electrical contact on a DUT and the probe card will often have fewer probe contacts than the DUT has solder bumps or electrical contacts. It may also be that the probe head 308 and probe contacts 310 are configured to test across more than one DUT. As shown by the three two-way arrows 320, the prober system can move the wafer chuck in three substantially perpendicular directions. Conventionally, the DUT 312 is positioned by the prober system under the probe head and then raised vertically so as to bring into physical contact the solder bumps on the DUT with the probe contacts 310.

In conventional systems having flat-tipped probe contacts, once the DUT is located under the probe head, the DUT is moved in only one direction—i.e. vertically in the direction of the probe head. As the probe contacts 310 hang straight down from the probe head, and as the DUT is raised substantially along the same axis defined by the probe contacts, the solder bumps contact the flat side of probe contacts. The system may be set to overdrive the DUT in the vertical direction by moving the DUT beyond the point of initial contact between the surface of the solder bump and the bottom surface of the probe contact. In such case, the probe contact is pressed into the surface of the solder bump and the bump may be flattened to an extent. The appropriate overdrive distance to force a probe contact tip into solid physical contact with the solder bump will vary with the DUT. In the TEL probers mentioned above, for example, overdrive limits for the probe may be set within a range from about 0 µm to about 1000 µm. The overdrive distance will typically be in a range between about 5 µm and about 250 µm beyond initial contact for solder bumps having diameters of 5 mil or less, although the full overdrive range of the prober may be used (e.g., 1000 µm).

Figure 4A:
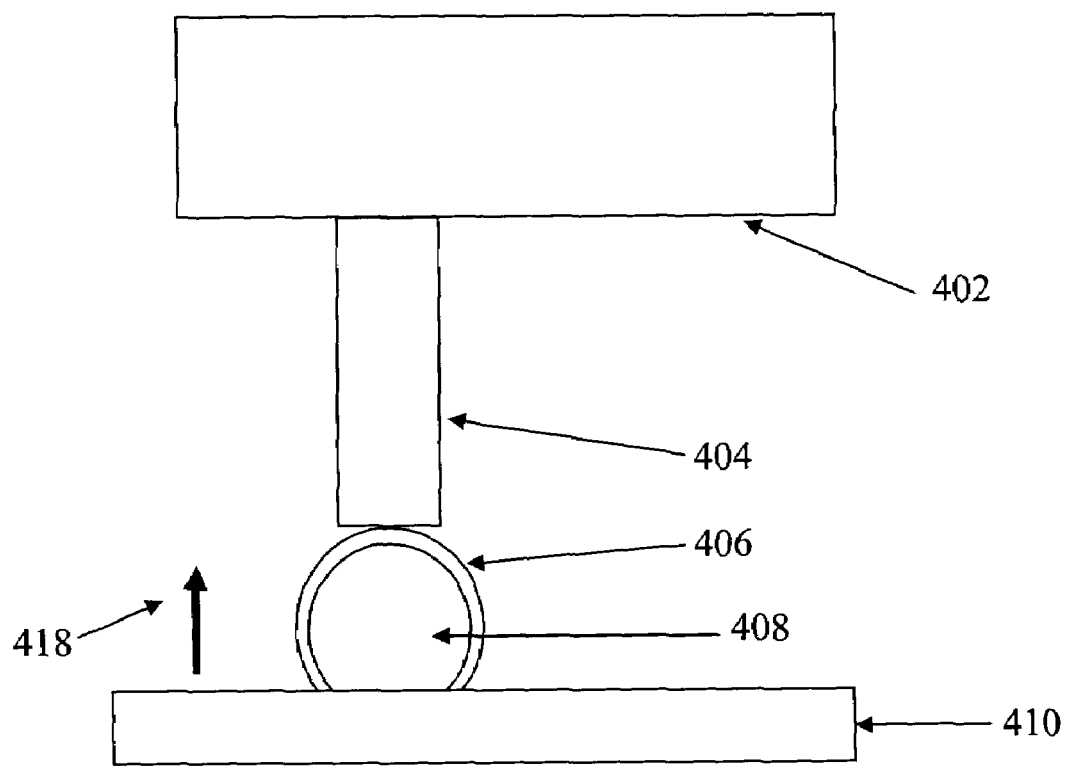
FIG. 4A is a cross-sectional side view of a flat-tipped probe card contact in initial contact with a solder bump having a contaminant film on its outer surface.
Figure 4B:
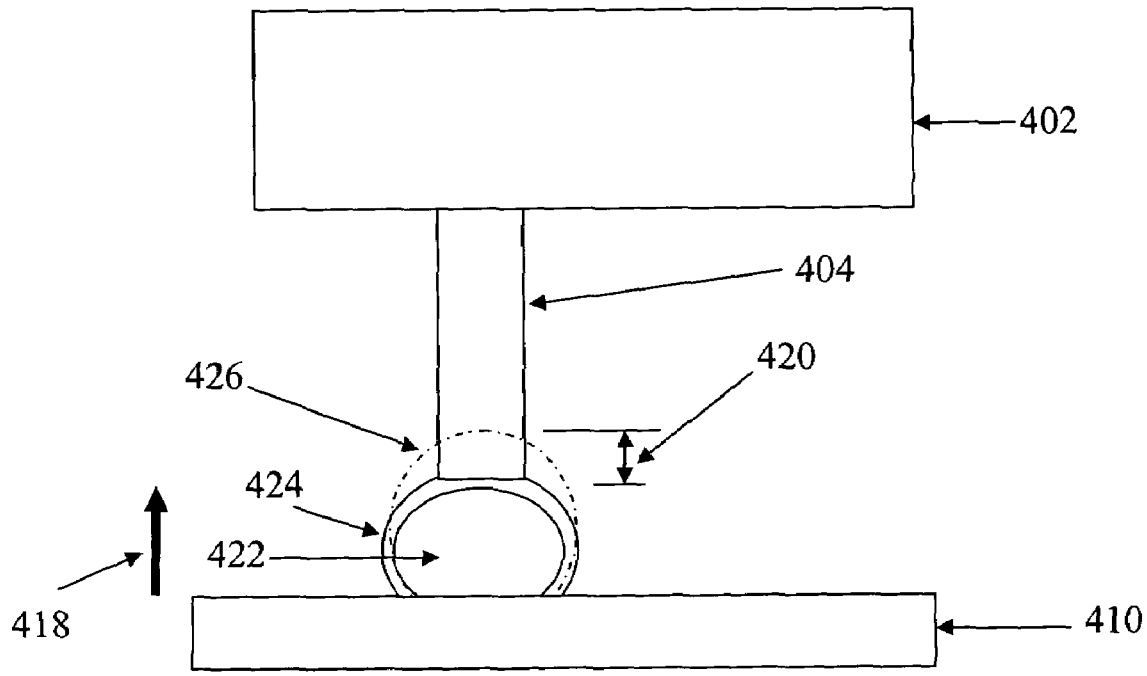
FIG. 4B is a cross-sectional side view of a flat-tipped probe card contact after overdriving the contact into a solder bump having a contaminant film on its outer surface.

FIGS. 4A and 4B are more detailed representations of the vertical contact made between a probe contact 404 on test head 402 and solder bumps 408, 422. In FIGS. 4A and 4B, like reference numerals designate like parts. In FIG. 4A, initial contact is shown between the probe contact 404 (shown here as a VSC probe contact, for example) and device solder bump 408 as the device wafer 410 is raised (arrow 418). Raising the device brings a solder bump 408 into initial contact with the bottom surface of a probe contact 404. A layer of oxide 406 is shown on the solder bump 408. Of course, other dielectric substances may also be found on the surface of the solder bump 408. As shown, the oxide 406 prevents direct physical contact between the probe contact 404 and the solder bump 408 proper. The oxide 406 also limits or prevents direct electrical contact between the probe contact 404 and the solder bump 408.

Typical vertical spring probes have a spring mechanism that allows the probe contact 404 to contact a solder bump 408 with some amount of pressure defined by the spring stiffness. For example, the Vertical Spring Card (VSC) configuration manufactured by JEM America Corporation of Fremont, Calif., has a spring included to form a pogo-pin type contact. Another example is the COBRA probe contact, which has a sickle-shape and has similar spring characteristics to those of the VSC technology. COBRA Probe Contacts may be found in the products of a number of manufacturers, such as, for example, Wentworth Laboratories, Inc. of Brookfield, Conn., and Kulicke and Soffa Industries, Inc. of Willow Grove, Pa. It is understood that these are not the only probe card contacts that may be used with embodiments of the present invention. The normal force of a typical VSC or COBRA prober is usually in the range of between about 1 gram of normal force per mil (1 mil=25.4 micrometers (µm)) of overdrive and about 4 grams of normal force per mil of overdrive. In this way, the probe contact is not rigid (at least to the extent that the spring is not fully compressed against the probe card), and overdriving does not cause the solder bump to be crushed.

FIG. 4B shows overdriving a second solder bump 422 beyond the point of initial contact. By continuing to raise the device in the direction shown by arrow 418, the probe contact 404 is pressed into the top surface of the solder bump 422. A layer of oxide 424 is also compressed by the overdriving action, but the oxide may not be penetrated by the overdrive alone. The original shape of the second solder bump 422 with oxidized surface 424 is shown in phantom 426 to illustrate the distance 420 of the overdrive.

As indicated above, the oxidized surface of a solder bump introduces unwanted resistance between the probe contact and the DUT that may prevent any test signal from reaching the DUT or any response signal from reaching the probe contacts. Even if the oxide is cleaned off of a majority of solder bumps, a single I/O solder bump with an oxidized surface may cause the device to fail in testing, because I/O solder bumps usually are not redundantly configured. Power and ground solder bumps, however, are typically formed in a redundant configuration such that sufficient power and ground connections are provided to the device even if one or more, but not all, of the power or ground solder bumps have oxidized surfaces.

Figure 5:
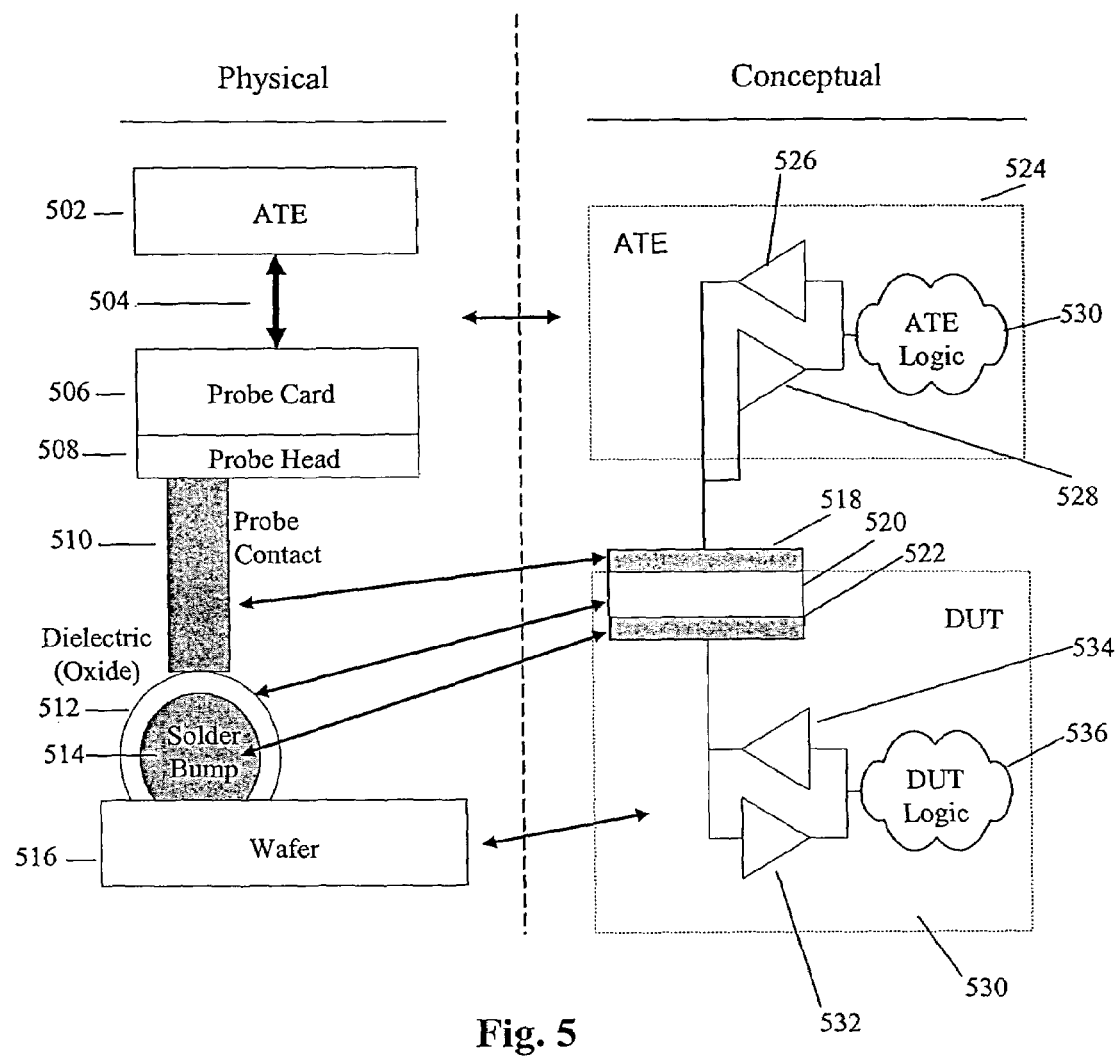
FIG. 5 is a physical and conceptual diagram of the capacitive character of the probe card contact-oxide-solder bump interface.

Embodiments of the present invention that solve this problem for I/O solder bumps use the capacitor formed at the interface of the metal probe contact, the oxide dielectric on a solder bump and the metal of the solder bump to test the DUT. As illustrated in FIG. 5, the automatic test equipment (ATE) 502 is coupled by connectors 504 to the probe card 506 and probe head 508, which holds a metal probe contact 510. The metal probe contact 510 is in physical contact with the oxide 512 on the metal solder bump 514 on wafer 516.

Conceptually, the metal of the probe contact 518 and the metal of the solder bump 522 form two sides (i.e. two substantially parallel metal plates) of a capacitor having an oxide dielectric 520 between them. The ATE 524 can be conceptually viewed as an input buffer 528 and an output buffer 526 coupled between the probe contact 518 and the ATE logic 530. Similarly, the DUT can be conceptualized as an input buffer 532 and output buffer 534 coupled between the solder bump 522 and DUT logic 536. It is understood that any given signal between the ATE and DUT may pass through one or more I/O solder bumps in traveling back and forth between the ATE and DUT, and thus the signal may pass through one or more interface capacitors.

Rather than cleaning off or breaking through the oxide on each and every I/O solder bump on a DUT, the characteristics of the interface capacitor of any I/O solder bump that has remaining surface oxide are used to transmit a signal across the interface to test the DUT. Data is transferred in both directions between the ATE and DUT, so both can be a load and both can be a driver during testing. The driver is the device or equipment sending out a signal, and the load is the device or equipment receiving the signal.

Figure 6:
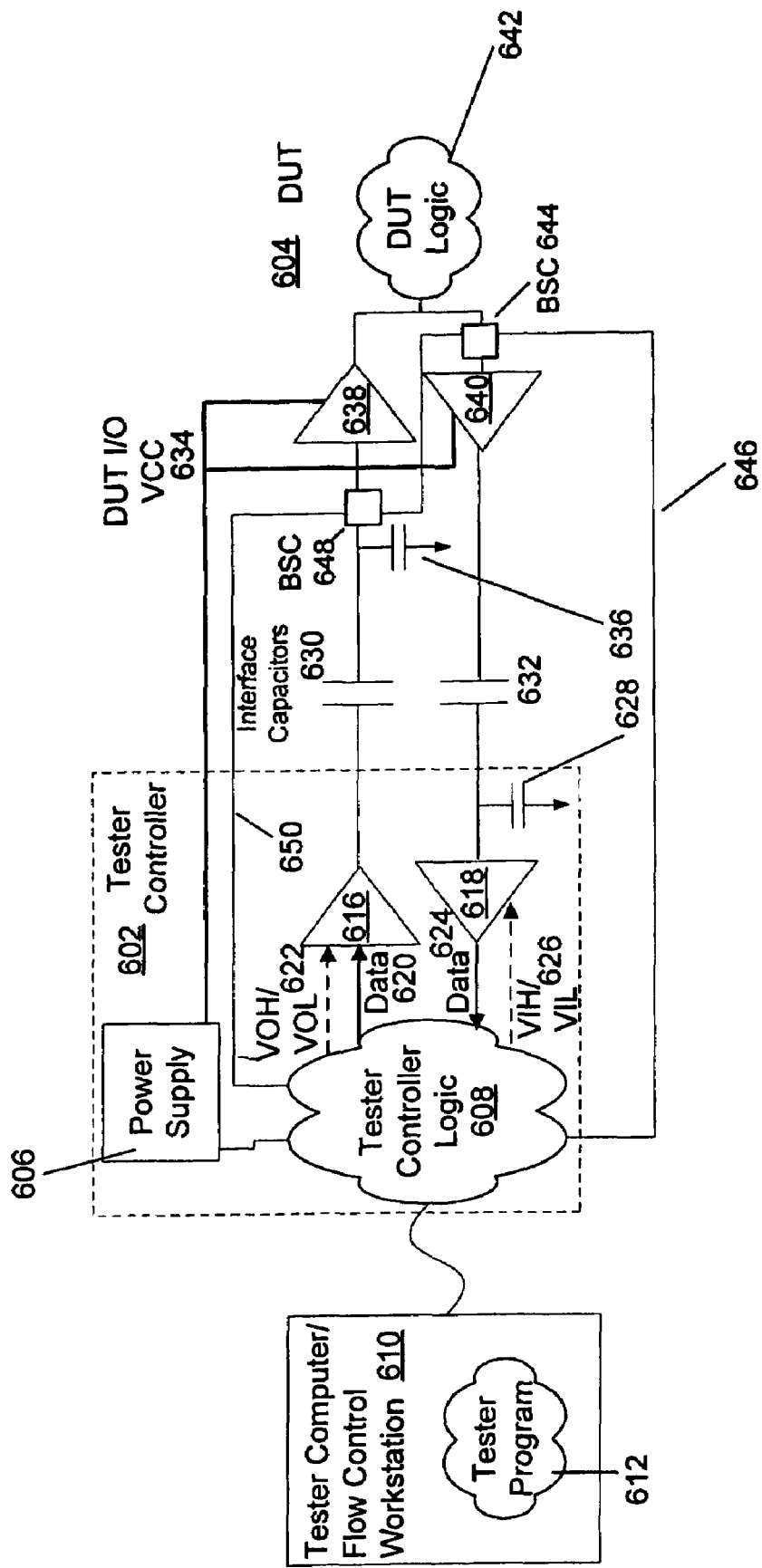
FIG. 6 is a diagram of the capacitive characteristics of the Automated Test Equipment (ATE), the oxide-solder bump interface and the Device Under Test (DUT).

The capacitor at the interface will have a voltage drop across it, because a capacitive divider is formed between the interface capacitor and the inherent capacitance of the load. As illustrated in FIG. 6, a capacitive divider is formed between the output buffer 616 of the ATE 602 and the input buffer 638 of the DUT 604 by the interface capacitor 630 and the DUT capacitor 636. In the opposite direction, a capacitive divider is formed between the DUT output buffer 640 and the ATE input buffer 618 by the interface capacitor 632 and the ATE capacitor 628. ATE capacitor 628 and DUT capacitor 636 are inherent to the ATE and DUT, respectively. The ATE capacitance is typically caused by the pin electronics and the trace connections for the channels that connect the ATE and the DUT. For a Teradyne J750 ATE system manufactured by Teradyne, Inc. of Boston, Mass., for example, a typical ATE capacitance is about 66 pF. The DUT capacitance is typically caused by DUT circuits, such as, for example, the gate capacitance on an input buffer, but DUT capacitance may also include package capacitance. DUT capacitances typically are in a range between about 3 pF and about 15 pF. A capacitive divider in either direction will cause a voltage drop across the interface capacitor which will reduce the amount of voltage received by the load when attempting to transfer a valid digital high signal (i.e. a "1") between the driver and load. For a valid digital "1" to be received at the load's input buffer, the voltage observed at the load end must be greater than the voltage input high amplitude parameter (VIH) of the load's input buffer. VIH is the threshold above which a received voltage signal will be perceived by the input buffer as a digital "1".

FIG. 6 also illustrates the control parameters for the drivers and loads. Each output buffer has a voltage output high amplitude parameter (VOH) which defines the amplitude used in sending out a digital "1" signal. Each output buffer may also have a voltage output low amplitude parameter (VOL) which defines the amplitude used in sending out a digital "0" signal. For input buffers, VIH defines the threshold voltage amplitude at which the input buffer will perceive a digital "1" in a received voltage signal. An input buffer may also have a voltage input low amplitude parameter (VIL) which defines a threshold voltage amplitude at which the input buffer will perceive a digital "0" in a received voltage signal. In the ATE 602, the VOH and VOL for the output buffer 616 (i.e. $VOH_{ATE}$ and $VOL_{ATE}$ 622) are set through the tester controller logic 608. Similarly, the VIH and VIL for the input buffer 618 of the ATE 602 (i.e. $VIH_{ATE}$ and $VIL_{ATE}$ 626) are set through the tester controller logic 608. Values for $VOH_{ATE}$, $VOL_{ATE}$, $VIH_{ATE}$ and $VIL_{ATE}$ may be set by an operator using the tester computer/flow control workstation 610 and the tester program 612. A power supply 606 supplies power to the tester controller logic 608. Test data 620 is provided to the ATE output buffer 616 through tester controller logic 608 and may be entered through tester computer 610 and tester program 612. Data 624 received in tester input buffer 618 is the output response from the DUT 640 after transmission through the interface capacitor 632. Additionally, for JTAG Boundary Scan enabled DUTs, test data and response data may be entered and received through the boundary scan cells (BSC) 644, 648. For example, the signal received at the DUT input buffer 638 may be read directly through boundary scan cell 648 via a connection 650 to a boundary scan TDO pin. The signal output from the DUT 604 can be set by importing data to the boundary scan cell 644 from Tester Controller 602. Thus, in addition to or instead of data provided to DUT output buffer 640 from the DUT logic 642, test signals may be provided serially through connection 646 to a boundary scan TDI pin and into boundary scan cell 644.

On DUT 604, the input buffer 638 and the output buffer 640 receive supply voltage (i.e. VCC) from power supply 606 through connection 634. Connection 634 may include several separate connectors to various buffers. Connection 634 is typically coupled to power solder bumps on the DUT. The input buffers and output buffers for the DUT may receive the same or different supply voltages. The input buffer 638 typically has voltage input high amplitude and voltage input low amplitude parameters (i.e. $VIH_{DUT}$ and $VIL_{DUT}$, respectively) that are related to the DUT I/O VCC supply voltage. For example, in CMOS chips, the $VIH_{DUT}$ will often be about one-half of the maximum DUT I/O VCC supply voltage. The output buffer 640 typically has voltage output high amplitude and voltage output low amplitude parameters (i.e. $VOH_{DUT}$ and $VOL_{DUT}$) that are related to the DUT I/O VCC supply voltage. For example, the $VOH_{DUT}$ will often be set at the maximum DUT I/O VCC supply voltage amplitude. Alternately, the DUT may be of a type that allows for output and input buffer voltage parameters that are set at various percentages of the supply voltage. For these types of devices, $VIH_{DUT}$ may be set in a range between 0% and about 60% of the supply voltage, for example at 30%. $VOH_{DUT}$ may be set in a range between about 50% and about 100% of the supply voltage, for example at 70%.

Embodiments of the invention include a method and computer program product which alter one or more voltage parameters in the ATE and/or DUT in order to pass a test voltage signal having good signal integrity across all I/O solder bumps regardless of the existence of a dielectric layer on one or more of these solder bumps. The voltage parameters that may be altered include $VOH_{ATE}$, $VOH_{DUT}$, $VIH_{ATE}$ and $VIH_{DUT}$. These parameters are altered in order to satisfy certain relationships between VOH, VIH, load capacitance, and interface capacitance between the DUT and ATE. The amount of voltage received at an input buffer of a load depends on the driver's voltage output and the ratio of the load capacitance to the interface capacitance. This dependency is further described by the following relationships representing various aspects of the embodiments of the present invention.

As for any capacitor, the following relationship defines the charge (q) on a capacitor:

$$q = CV \qquad (1)$$

where C is the capacitance of the capacitor and V is the voltage across the capacitor. Thus, for the interface capacitor, $q_I = C_I V_I$, and for the DUT capacitor (i.e. the inherent capacitance of the DUT), $q_{DUT} = C_{DUT} V_{DUT\ C}$, where $C_{DUT}$ is the inherent DUT capacitance and $V_{DUT\ C}$ is the voltage across the DUT capacitor.

As described above with reference to FIG. 6, for test signals sent from ATE output buffer 616 through interface capacitor 630 and into DUT input buffer 638 (i.e. the ATE is the driver and the DUT is the load), a capacitive divider is set up by the interface capacitor and inherent DUT capacitor. Based on the properties of capacitive dividers, the charge on the interface capacitor ($q_I$) must equal the charge on the DUT capacitor ($q_{DUT}$). Thus, $$q_I = C_I V_I = q_{DUT} = C_{DUT} V_{DUT\ C}. \qquad (2)$$

For a voltage output high signal from the ATE (i.e. $VOH_{ATE}$), the sum of the voltages across the capacitive divider satisfies the following relationship:

$$VOH_{ATE} \approx V_I + V_{DUT\ C}, \qquad (3)$$

where $V_I$ is the voltage across the interface capacitor and $V_{DUT\ C}$ is the voltage across the inherent DUT capacitor.

In order to receive a valid digital "1" at the DUT input buffer when a digital "1" is output by the ATE, the received voltage at the input buffer (i.e. $V_{DUT\ C}$) must satisfy the following relationship:

$$V_{DUT\ C} > VIH_{DUT}. \qquad (4)$$

Using relationships (2) through (4) and solving for $VOH_{ATE}$, the voltage output high amplitude at the ATE required to ensure the received voltage at the DUT is high enough for the DUT input buffer to read a valid digital "1" satisfies the following relationship:

$$VOH_{ATE} > VIH_{DUT}(1 + C_{DUT}/C_I). \qquad (5)$$

Similarly, when the DUT acts as the driver and the ATE is the load (i.e. in the return path), a similar set of relationships produces the following relationship:

$$VOH_{DUT} > VIH_{ATE}(1 + C_{ATE}/C_I). \qquad (6)$$

Relationships (5) and (6) show that the minimum VOH of either the ATE or the DUT must be greater than the required VIH of the load by a factor of one plus the ratio of load capacitance divided by the interface capacitance. The interface capacitor will consume some of the voltage across it based on the ratio of the load capacitance and the interface capacitance. If $C_I$ is very close to or larger than the load capacitance, then the VOH of the driver can usually be raised high enough to achieve a valid signal at the load. This is particularly true if the VIH of the load is one-half or less of the DUT VCC. This is often the case for standard CMOS buffers. The voltages applied across the interface and into the DUT are typically limited to voltages that will not damage the DUT.

Figure 7A:
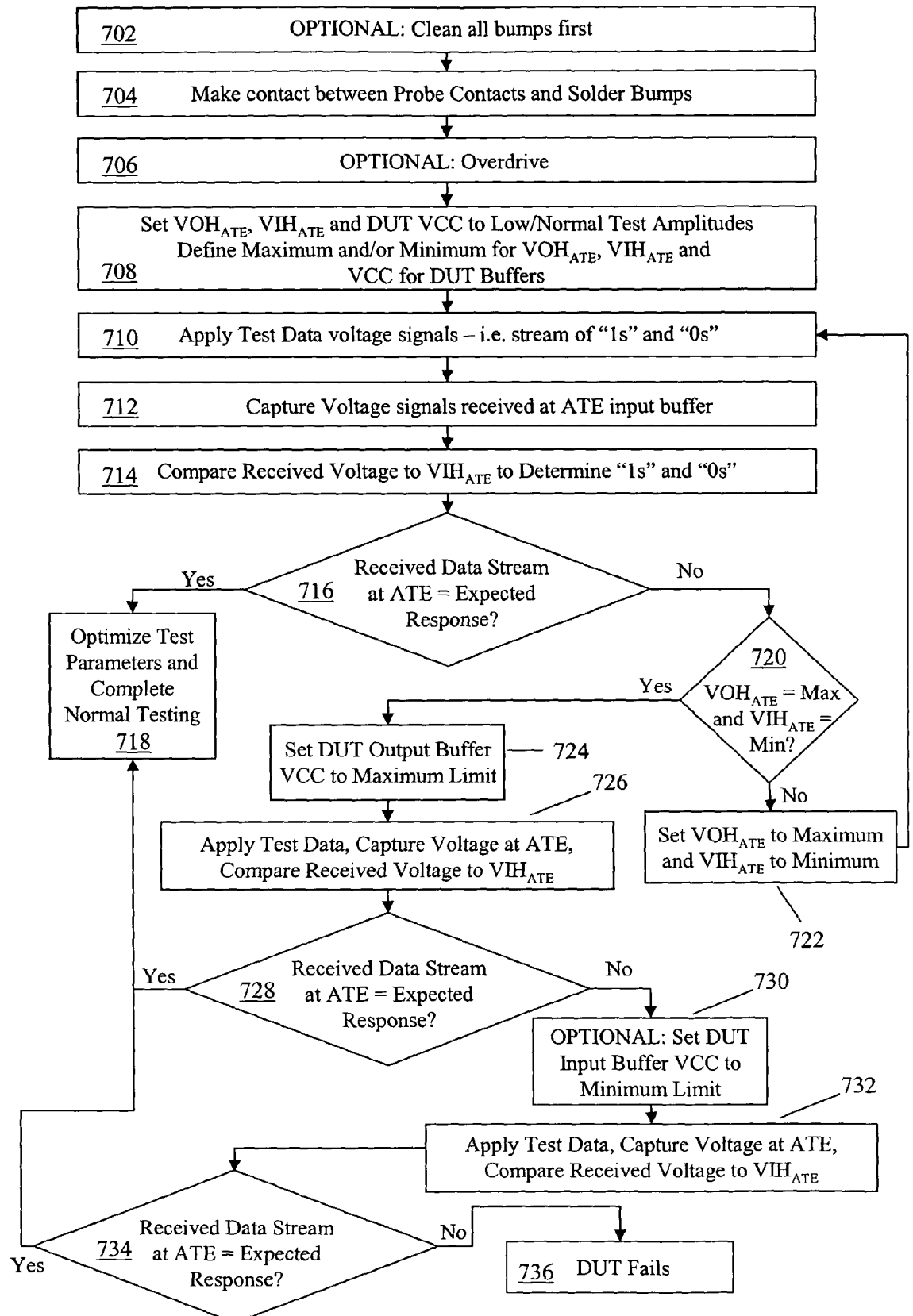
FIG. 7A is a flowchart of a method for using the capacitive character of the probe-oxide-solder bump interface to improve the testing of the device in accordance with embodiments of the present for a device without Boundary Scan Technology architecture.
Figure 7B:
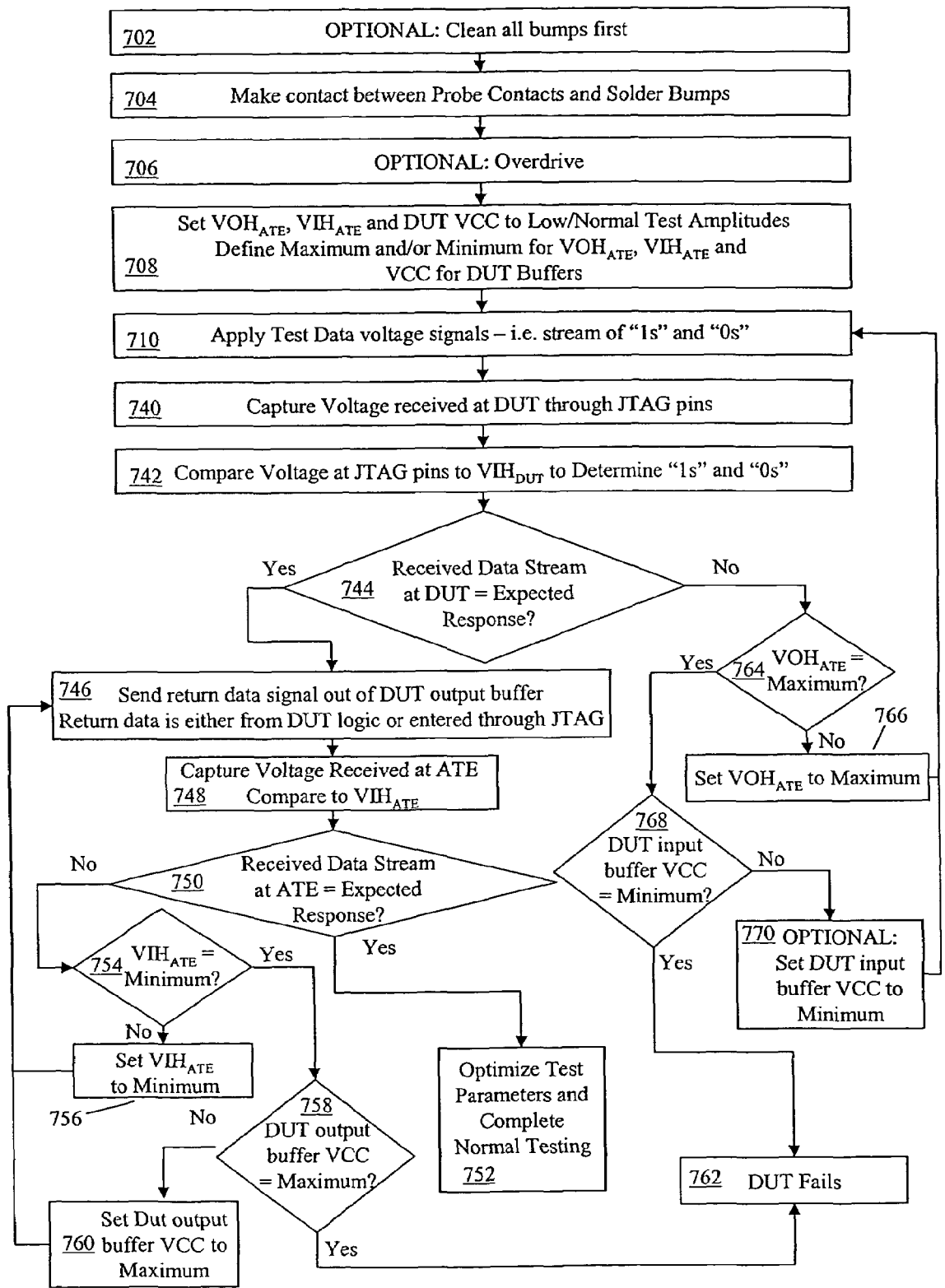
FIG. 7B is a flowchart of a method for using the capacitive character of the probe-oxide-solder bump interface to improve the testing of the device in accordance with embodiments of the present for a device with Boundary Scan Technology architecture.

FIGS. 7A and 7B are flowcharts depicting embodiments of methods for practicing the present invention in testing I/O solder bumps in accordance with the relationships above. In FIGS. 7A and 7B, like reference numerals designate like parts. As illustrated in the flowchart of FIG. 7A, the method for testing solder bumps in devices without JTAG Boundary Scan architecture is optionally initiated at step 702 by cleaning all bumps on a device using one or more of the mechanical, electrical or chemical cleaning methods known in the art. If step 702 is not used, then the method is initiated at step 704 by moving a DUT into contact with a set of probe card contacts. Once initial contact is made, the device may optionally be raised a further distance in the vertical direction. This additional vertical movement is the overdrive of step 706.

At step 708, normal test voltage amplitudes are set for $VOH_{ATE}$, $VIH_{ATE}$ and VCC for DUT input buffers and VCC for DUT output buffers. These normal test voltage amplitudes are the typical or target test voltage amplitudes for these ATE and DUT voltage parameters. Normal operating voltage for conventional DUTs is typically 5 volts or less, and $VOH_{ATE}$ is usually set to correspond to the DUT's normal operating voltage. For example, $VOH_{ATE}$ may be set to 3.3 Volts, $VIH_{ATE}$ set to 1.4 Volts and VCC for the I/O buffers to 3.3 Volts. Typically, $VOL_{ATE}$ is set to 0.0 Volts and $VIL_{ATE}$ is set to about 0.4 Volts. With I/O VCC set to 3.3 Volts, a typical CMOS DUT will have the following voltage parameters: $VOH_{DUT}$ at about 3.3 Volts; $VIH_{DUT}$ at about 1.4 Volts; $VOL_{DUT}$ at about 0.0 Volts; and $VIL_{DUT}$ at about 0.4 Volts. Additionally, a maximum $VOH_{ATE}$, a maximum DUT output buffer VCC, a minimum $VIH_{ATE}$ and a minimum DUT input buffer VCC are set. In many DUTs, a single DUT I/O VCC supplies voltage to both input and output buffers such that the voltage parameters for the input and output buffers (i.e. $VOH_{DUT}$ and $VIH_{DUT}$) cannot be separately and simultaneously controlled. Typically, the maximum $VOH_{ATE}$ is set within a range less than or equal to about 50% above normal operating voltage for the ATE, and preferably is set at about 20% above normal operating voltage. A maximum DUT output buffer VCC is typically less than about 50% above the normal operating voltage for the DUT, and preferably is set at about 20% above the normal operating voltage. The normal test voltage amplitudes and maximum and minimum values are typically set by an operator in a register or memory of the tester controller computer, but they may also be set automatically by a computer program or the tester logic.

The DUT is tested initially at step 710 by applying a test data stream of "1's" and "0's" from the probe card contacts to the solder bumps of the DUT using the normal test voltage amplitudes set in step 708. During sorting DUTs are typically tested below operating frequencies, although at-speed testing may also be used. For example, a typical DUT may be tested at about 50 MHz, while operating frequencies may be above 100 MHz. The voltage signals received back from the DUT at the ATE input buffer are captured at step 712. The voltage signals received at the ATE input buffer are compared at step 714 to $VIH_{ATE}$ to determine the stream of "1's" and "0's" received. At step 716 a comparison is made between the received data stream and the expected response to determine if the received data stream at the ATE matches the expected response. The comparison may be completed manually or automatically in the tester logic or tester computer program modules.

If the received data stream at the ATE matches the expected response, then the DUT is subjected to normal testing at step 718. Normal testing may include functional and/or at-speed testing. If the received data stream at the ATE does not match the expected response, then the $VOH_{ATE}$ and $VIH_{ATE}$ are examined at step 720 to determine if they are set at the maximum level for $VOH_{ATE}$ and minimum level for $VIH_{ATE}$ defined in step 708. If $VOH_{ATE}$ and $VIH_{ATE}$ are not at their maximum and minimum levels, respectively, then at step 722 $VOH_{ATE}$ and $VIH_{ATE}$ are set at their maximum and minimum levels, and a test sequence is initiated by returning to step 710. VOH$_{ATE}$ and VIH$_{ATE}$ may be set separately, and separate test sequences may be run after each is altered.

If VOH$_{ATE}$ and VIH$_{ATE}$ are at their maximum and minimum levels, respectively, then at step 724 the DUT output buffer VCC is set to the maximum level defined in step 708. A test sequence is then initiated at step 726 to test the DUT using the maximum DUT output buffer VCC. The test sequence at step 726 includes steps substantially similar to those of steps 710 through 714.

At step 728 a comparison is made between the received data stream at the ATE input buffer and the test data stream to determine if the received data stream matches the expected response. If the received data stream and the expected data stream match, the test parameters may be optimized and normal testing conducted at step 718. Optimizing test parameters at step 718 includes altering one or more of the test voltage parameters (i.e. VOH$_{ATE}$, VIH$_{ATE}$, DUT output buffer VCC and DUT input buffer VCC) from its maximum or minimum in the direction of its normal test levels, and then re-testing the device at the altered levels to determine if the device response still matches the expected response. Altering the one or more test voltage parameters may include using a pre-set voltage value to step the voltage parameter amplitude up or down by a predetermined amplitude. Optimizing serves to bring the test voltage parameters as close to normal test levels as possible while still remaining at levels at which the device will respond as expected. Typically, test operators want the test voltage parameters to remain as close to normal testing and normal operating levels as possible. For example, if normal VOH$_{ATE}$ is 5 volts, and the device responds as expected at a maximum VOH$_{ATE}$ of 7.5 volts but not at 5 volts, then optimizing may include reducing VOH$_{ATE}$ from 7.5 volts until the device fails to respond as expected. The VOH$_{ATE}$ is then set at a level just above the failure point. A similar optimization process may be run for VIH$_{ATE}$, DUT output buffer VCC and DUT input buffer VCC, either individually or in combination. For example, VIH$_{ATE}$ may be altered by raising it from its minimum level towards normal testing or operating levels until a failure point is reached, and then VIH$_{ATE}$ is set just below the failure point.

If the received data stream does not match the expected response at step 728, then at optional step 730 the DUT input buffer VCC is set to the minimum level defined in step 608 in order to reduce VIH$_{DUT}$. Step 730 is optional for many DUTs, because setting the DUT input buffer VCC to a minimum level may also reduce the DUT output buffer voltage (i.e. VOH$_{DUT}$) to a level at which the DUT cannot drive a response signal back to the ATE. A test sequence is initiated at step 732 to test the DUT using the minimum DUT output buffer VCC. The test sequence at step 732 includes steps substantially similar to those of steps 710 through 714. At step 734 a comparison is made between the received data stream at the ATE input buffer and the expected response to determine if the received data stream matches the expected response. If the received data stream and the expected data stream match, the test parameters may be optimized and normal testing conducted at step 718 as described above. If the received data stream and the expected data stream do not match, then the DUT fails 736, as all test voltage parameters have been set to their respective maximum or minimum levels and still the device has not responded as expected.

FIG. 7B depicts a method of testing the I/O solder bumps on a device having JTAG Boundary Scan architecture. Only those parts of the method for testing devices with JTAG Boundary Scan architecture that differ from the method described above for testing non-JTAG devices will be described in detail below. Steps 702 through 710 in FIG. 7B are substantially similar to the corresponding steps in FIG. 7A. At step 740, the voltage signals applied from the probe card contacts to the solder bumps of the DUT are captured at the boundary scan cells and read out through a JTAG TDO serial output pin on the DUT. At step 742, the voltage signals received at the JTAG boundary scan cells and read out through the TDO pin are compared to VIH$_{DUT}$ to determine the received stream of "1's" and "0's".

At step 744, a comparison is made between the received stream and the expected response to determine if the received stream matches the expected response. The comparison at step 744 may be completed manually or automatically in the tester logic or tester computer program modules. If the received stream does not match the expected response, then at step 764 VOH$_{ATE}$ is checked to see if it is currently set at its maximum voltage as defined in step 708. If not, then at step 766 VOH$_{ATE}$ is set to its maximum and steps 710-744 are repeated. If VOH$_{ATE}$ is already set to its maximum voltage, then at step 768 DUT input buffer VCC (i.e. VIH$_{DUT}$) is checked to see if it is currently set to the minimum voltage defined for it at step 708. If not, then at optional step 770 DUT input buffer VCC is set to its minimum and steps 710-744 are repeated. Step 770 is optional because in many DUTs setting the DUT input buffer VCC to a minimum level will also reduce the DUT output buffer voltage (i.e. VOH$_{DUT}$) to a level at which the DUT cannot drive a response signal back to the ATE. If at step 768 it is determined that DUT input buffer VCC is set at its minimum, then the DUT fails 762, as all test voltage parameters in the input path to the DUT have been set to their respective maximum or minimum levels and still the device has not responded as expected.

If the tester logic determines at step 744 that the signals received at the boundary scan cells of the DUT match the expected response, then at step 746 a return signal is sent out of the DUT output buffer through the solder bumps and probe card contacts to the ATE. Return test data may be from the DUT logic (i.e. the DUT's response to the test data sent from the ATE), or it may be read serially into the boundary scan cells of the DUT through the JTAG TDI serial input pin. Signals from the DUT logic may be in response to test data signals from the ATE that are input through either the DUT's I/O solder bumps or serially through the DUT's TDI pin and boundary scan cells.

At step 748, voltage signals received at the ATE input buffers are captured and the received signals are compared to VIH$_{ATE}$ in the tester logic to determine the received digital data stream of "1's" and "0's". At step 750, the received digital data stream is compared to the expected response. If the received data stream matches the expected response, then test voltage parameters (i.e., VOH$_{ATE}$, VIH$_{ATE}$, DUT I/O Buffer VCC) are optimized as needed, and the DUT is subjected to normal testing at step 752. If the received data stream at the ATE does not match the expected response, then at step 754 VIH$_{ATE}$ is checked to see if it is currently set at the minimum voltage defined at step 708. If not, then at step 756 VIH$_{ATE}$ is set at its minimum voltage and steps 746-750 are repeated to test the return path from the DUT to the ATE. If at step 754 VIH$_{ATE}$ is already set to its minimum voltage, then at step 758 DUT output buffer VCC (i.e. VOH$_{DUT}$) is checked to see if it is currently set to the maximum voltage defined for it in step 708. If not, then at step 760 DUT output buffer VCC is set to its maximum and steps 746-750 are repeated. If at step 758 it is determined that DUT output buffer VCC is set at its maximum voltage, then the DUT fails 762, as all test voltage parameters in the return path have been set to their respective maximum or minimum levels and still the device has not responded as expected.

Overdrive to Increase Interface Capacitance

Alternate embodiments of the present invention may further include increasing the overdrive at the probe tip in order to increase the capacitance of the interface capacitor ($C_I$). Increasing $C_I$ increases the voltage coupled to the intended load. To reduce the driver VOH needed to satisfy Relationships (5) and (6), the overdrive of the vertical probe tips into the round solder bump surface is increased to expand the cross-sectional size of the interface capacitor. Increasing the cross-sectional area of the interface capacitor will increase the capacitance of the interface capacitor ($C_I$), which will decrease the VOH required as described by Relationships (5) and (6). The capacitance of $C_I$ increases according to the following relationship:

$$C = \frac{\text{Area} \times \varepsilon_0 \varepsilon}{d}, \quad (7)$$

Area is the cross-sectional area of the dielectric between two parallel conducting plates (i.e. two metal plates), d is the distance between the two conducting plates, $\varepsilon_0$ is the permittivity constant ($8.85 \times 10^{-12}$ Farad/meter), and $\varepsilon$ is the permittivity factor for the specific dielectric material used in a given capacitor. The area is increased with more overdrive, because the area of contact between the flat probe tip and the round solder bump will increase as the flat probe tip flattens and expands the contact area on the softer spherical solder bump.

The increase in voltage received at the load with an increase in interface capacitance ($C_I$) is shown for the DUT as load by re-arranging Relationship (2) as follows:

$$V_{DUTC} = \frac{C_I}{C_{DUT}} V_1. \quad (8)$$

A similar relationship holds for the ATE as load.

As illustrated in FIG. 4B, the contact area between the end of the probe contact and the oxide layer 424 is expanded during the compression of overdrive. This increases the cross-sectional area of the dielectric between two parallel conducting plates in accordance with relationship (7), thereby increasing the interface capacitance.

Computer Program Product

Figure 8:
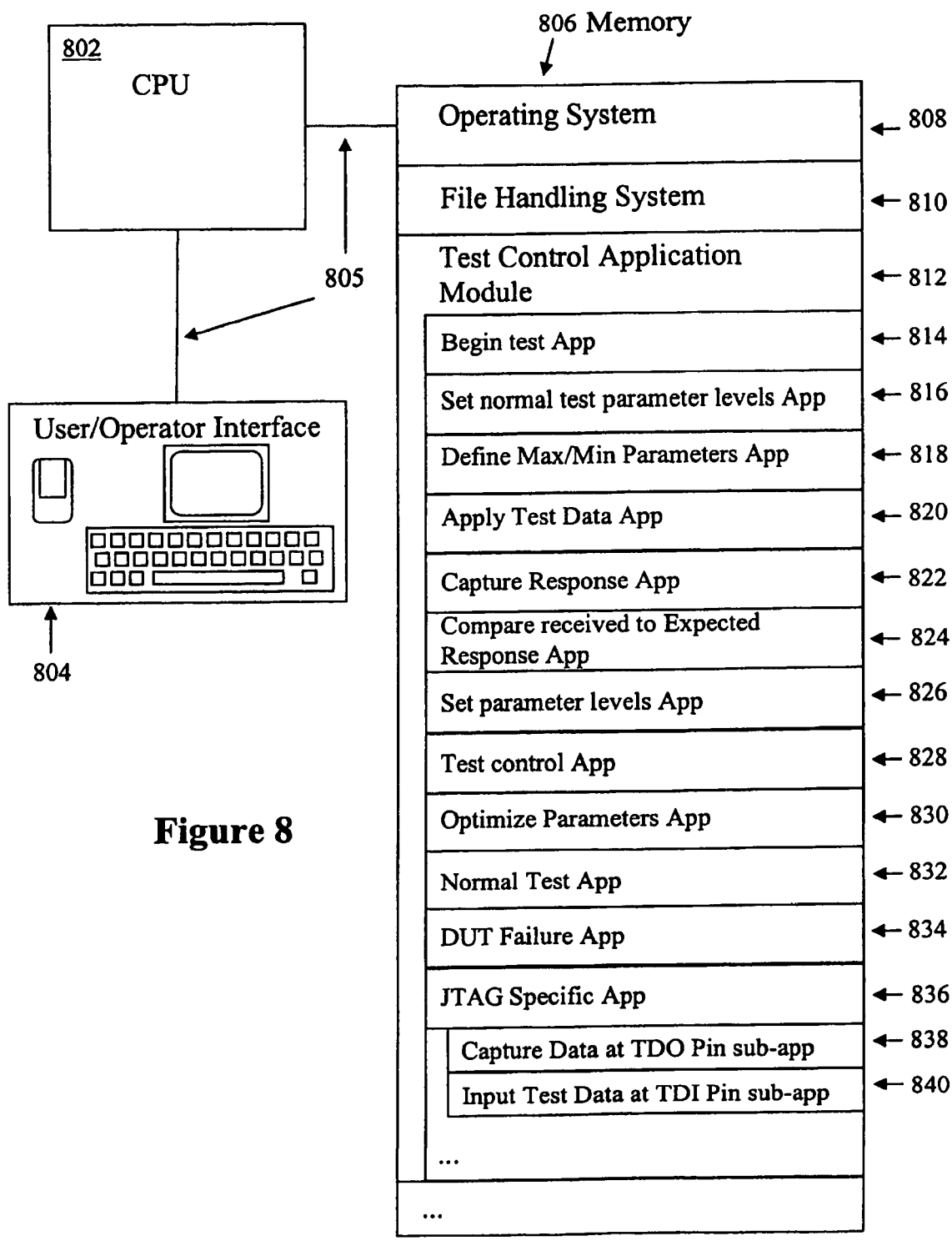
FIG. 8 is a diagram of the tester computer and memory with various program modules according to an embodiment of the present invention.

FIG. 8 shows a tester computer 800 having a central processing unit (CPU) 802, 1 user or system operator interface 804, a tester system memory 806 (which may include random access memory as well as disk storage and other storage media), and one or more buses 805 for interconnecting the aforementioned elements of the system. The operation of the automatic test system is controlled primarily by control programs that are executed by the tester computer's central processing unit 802, which directs the tester controller to employ its electronics to issue signals and power through the probe card contacts to DUTs. The control programs in the tester computer memory 806 include modules and instructions to implement and direct the steps of the methods described above in relation to FIGS. 6A and 6B. In a typical implementation, the programs and data structures stored in the system memory 806 will include:

an operating system 808 that includes procedures for handling various basic system services and for performing hardware dependent tasks;

a file handling system 810; and a test control application module 812 for setting test parameters, starting the testing, controlling the testing through the tester controller and receiving and capturing the output signals from the DUTs.

The operation of the tester computer 800 is controlled primarily by control programs that are executed by the tester system's central processing unit 802. In a typical implementation, the programs and data structures stored in the tester system memory 806 include a test control application module 812 with a number of modules and instructions therein. The test control application module 812 includes the following program modules and instructions:

a begin test application module 814 that includes instructions to direct the prober computer to signal the prober controller to move the wafer chuck to bring one or more designated devices into contact with a set of probe card contacts. The begin test application module 814 may include optional instructions to signal the prober computer to cause the probe controller to overdrive the device onto the probe card contacts by moving the wafer chuck and DUT a distance beyond initial contact.

a set normal test parameter application module 816 that includes instructions to set the normal testing voltage amplitudes for $VOH_{ATE}$, $VIH_{ATE}$, VCC for DUT output buffer and VCC for DUT input buffer. These voltage amplitudes are defined in a function call or stored as a test constant in computer memory 806. For example, the voltage amplitudes for $VOH_{ATE}$ and VCC for DUT output buffer may be set at about 5 volts or less, depending on the operating characteristics of the DUT.

a define maximum and minimum voltage parameters application module 818 may also be included to set the voltage amplitude maximum for $VOH_{ATE}$ and VCC for DUT output buffer, and to set the voltage amplitude minimum for $VIH_{ATE}$ and VCC for DUT input buffer. These maximum and minimum voltage amplitudes are also defined in a function call or stored as a test constant in computer memory 806 and is set at a pre-determined levels calculated to be just short of damaging the device. For example, the maximum voltage amplitude for $VOH_{ATE}$ and VCC for DUT output buffer may be set up to about 50% above their respective normal operating voltages, and preferably at about 20% above their respective normal operating voltages.

an apply test data application 820 that includes instructions to cause the ATE output buffer to send a test data signal through the probe contacts, across the interface capacitor and into the DUT. The test data signal is sent initially at the normal test amplitude for $VOH_{ATE}$, unless $VOH_{ATE}$ has been set to its maximum voltage amplitude.

a capture response application 822 that includes instructions to capture a voltage response from the DUT at an input buffer of the ATE. The capture response application 822 further includes instructions to compare the received voltage response to the voltage input high threshold (VIH) for the input buffer in order to determine the digital data stream of "1's" and "0's" received by the input buffer.

a compare received to expected response application 824 that includes instructions to compare the data stream received to the expected response for the DUT. The expected response may be the test data sent out by the driver's output buffer, or it may be the response expected from operations in the DUT's logic. The compare received to expected response application 824 includes instructions to signal the tester computer and/or tester logic as to whether or not the received response matches the expected response.

a set voltage parameter amplitudes application 826 that includes instructions to set voltage amplitudes for $VOH_{ATE}$, $VIH_{ATE}$, and VCC for DUT input and output buffers for use in the next application of the apply test data application 820. The voltage amplitudes for these parameters are set to levels defined in the set normal test parameter levels application 816 or the define max/min parameters application 818.

a test control application 828 includes instructions that set the order in which test parameters will be altered and test data signals re-applied to the DUT. For example, these instructions control whether VOH or VIH are altered together or at different times and in what order. The voltage parameters may be altered in any order that suits the test operator for the specific DUT. Further, these instructions control whether both a maximum and a minimum VCC voltage amplitude are set and applied to the DUT I/O buffers.

an optimize voltage parameters application 830 that includes instructions to optimize one or more voltage parameters in the ATE and/or DUT once the DUT has passed the initial testing using either the normal test parameter voltage levels or the maximum/minimum voltage levels. These instructions include altering the voltage amplitudes in the direction of the normal test voltage amplitudes set in application module 816 and re-testing the device at the altered amplitudes to determine if the DUT still passes the test at the altered amplitude. Voltage parameters are re-set to the amplitudes that are closest to normal test voltage amplitudes while still validly passing the test. Instructions to alter voltage amplitudes may include pre-defined step voltages or percentages, or may be set manually. For example, $VOH_{ATE}$ may be reduced from its maximum level by a step voltage of 0.1 volts or by 5% per step, or an operator may reduce it by manually entering a reduced voltage amplitude in the tester computer. Further, these instructions control whether test voltage parameters are altered individually or in one or more groups. For example, these instructions control optimization such that $VOH_{ATE}$ is optimized first, followed by $VIH_{ATE}$ and then VCC for the DUT I/O buffers, as needed. The optimization order may be set in any order that suits the needs of the test operator for the specific DUT.

a normal test application 832 that includes instructions to start the normal probe testing of the DUT. Typically, the first part of the normal test will include a traditional opens test to ensure that a good electrical contact has been established between the probe card contacts and the DUT. Then, further tests may be performed to test the operation of the DUT—i.e. input signals may be sent to the DUT and the resulting output signals of the device captured and evaluated for errors.

a DUT failure application 834 that includes instructions to signal the tester computer and/or tester logic that the DUT has failed the testing process and cannot be validly tested.

a JTAG specific application 836 that includes JTAG specific sup-application modules for use in testing devices that have JTAG Boundary Scan Cell (BSC) architecture. JTAG specific application 836 may include instructions for determining whether the DUT includes JTAG Boundary Scan architecture. JTAG specific sub-application modules may further include:

a capture data at TDO pin sub-application 838 that includes instructions to capture through a DUT TDO serial output pin voltage data received at the JTAG boundary scan cells.

an input test data at TDI pin sub-application 840 that includes instructions to enter test data signals through a DUT TDI serial input pin into the JTAG boundary scan cells.

EXAMPLE

The following tables show examples of various test parameters and pass/fail results for sample DUTs. Tables 1 and 2 are examples of the application of relationships (5) and (6), respectively. Table 1 illustrates examples wherein the ATE is the driver and a DUT is the load, and Table 2 illustrates examples of the reverse path. The epsilon used is an approximate one assuming lead-oxide, and includes both the permittivity constant ($\in_0$) and the permittivity multiplier ($\in$) for lead oxide. $C_I$ is calculated using relationship (7), with oxide thickness as the distance (d) between the two conducting plates. Contact areas are typical for solder bumps contacted by flat-tipped probe contacts.

TABLE 1

| | $VOH_{ATE}$ (V) | $VIH_{DUT}$ (V) | $C_{DUT}$ (pF) | Epsilon (F/m) | Contact area (m²) | Oxide thickness (m) | $C_I$ (pF) | $VOH_{ATE}$ > $VIH_{DUT}$ * (1 + $C_{DUT}/C_I$) |
|---|---|---|---|---|---|---|---|---|
| 1 | 3.3 | 1.7 | 10 | 2.2e-10 | 1.26e-9 | 3e-08 | 9.3 | Fail |
| 2 | 3.7 | 1.7 | 10 | 2.2e-10 | 1.26e-9 | 3e-08 | 9.3 | Pass |
| 3 | 3.3 | 1.4 | 10 | 2.2e-10 | 2.83e-9 | 3e-08 | 20.9 | Pass |

TABLE 2

| | $VOH_{DUT}$ (Volts) | $VIH_{ATE}$ (Volts) | $C_{ATE}$ (pF) | Epsilon (F/m) | Contact area (m²) | Oxide thickness (m) | $C_I$ (pF) | $VOH_{DUT}$ > $VIH_{ATE}$ * (1 + $C_{ATE}/C_I$) |
|---|---|---|---|---|---|---|---|---|
| 1 | 3.3 | 1.4 | 66 | 2.2e-10 | 2.83e-9 | 3e-08 | 20.9 | Fail |
| 2 | 3.8 | 1.4 | 66 | 2.2e-10 | 5.54e-9 | 3e-08 | 40.9 | Pass |
| 3 | 3.3 | 1.0 | 66 | 2.2e-10 | 5.54e-9 | 3e-08 | 40.9 | Pass |

Failures are cases in which electrical signals cannot propagate correctly across the interface capacitor. Passing examples illustrate that by changing voltage parameters or contact area, electrical signals can propagate correctly and the DUT may then be normally tested. Thus, in Table 1, example 1 is a failure, but by increasing $VOH_{ATE}$ (as in example 2) and/or decreasing $VIH_{DUT}$ and overdriving the device to increase the contact area and thereby the interface capacitance (as in example 3), the device passes and may then be tested across the interface capacitor. In Table 2, relative to example 1 of Table 2, $VOH_{DUT}$ and the interface capacitance may be increased and/or $VIH_{ATE}$ decreased to obtain a passing configuration.

The embodiments of the present invention described above result in improved yield, increased wafer sort production throughput and lowered hardware maintenance costs. These embodiments limit wear on the probe card contacts and cycle time through the factory as compared to repetitive pre-conditioning or probing techniques. By reducing both the cycle time through the factory and the individual DUT test times, the cost of producing the product can be reduced and the capacity of the production test floor can be increased. Increased test floor capacity reduces capital equipment and maintenance costs.

It should be clear to those skilled in the art that the present invention may apply to various devices having dielectric layers on metal contacts. In addition to the I/O pins discussed above, electrical contacts may include dedicated input and dedicated output pins. Various probe tip configurations and testing systems may be used to practice the embodiments of the invention. Embodiments of the present invention may be applied separately to individual I/O solder bumps or to all or a subgroup of I/O solder bumps at once. Further, the order of testing, altering voltage parameters and optimization may be set in a different manner to the examples described above without departing from the spirit and scope of the invention.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. A process of testing an electronic device having a plurality of solder bumps, comprising:
    moving the device in a first direction such that physical contact is made between one or more of said plurality of solder bumps and one or more of a plurality of metal probe card contacts, wherein a subset of the plurality of solder bumps include a dielectric layer covering a portion of a surface of said subset of solder bumps such that at least one capacitor is formed by one of the metal probe card contacts, the dielectric layer and one of the solder bumps within the subset; and
    testing the device by sending a voltage signal across the capacitor.

2. The process of claim 1, wherein the plurality of solder bumps comprise input-output solder bumps.

3. The process of claim 1, wherein the dielectric layer is an oxide.

4. The process of claim 1, further comprising cleaning the plurality of solder bumps before the step of moving the device in a first direction.

5. The process of claim 1, wherein said plurality of probe card contacts are flat-tipped Vertical Spring Card contacts.

6. The process of claim 1, wherein the device is a flip-chip electronic device.

7. The process of claim 1, wherein test vectors are used in testing the device, the test vectors including a stream of test data and a stream of data expected from the device in responding to the stream of test data.

8. The process of claim 1, wherein the device is a CMOS device, an input buffer and an output buffer of the device having voltage input high parameters and voltage output high parameters, respectively, that are set in response to a supply voltage applied to the device.

9. The process of claim 1, wherein making physical contact includes overdriving the device in the first direction a pre-defined distance beyond the point in the first direction where an initial physical contact is made between a subset of said plurality of probe card contacts and a subset of said plurality of solder bumps.

10. The process of claim 9, wherein said pre-defined distance beyond the initial contact is in a range between about 5 micrometers and about 250 micrometers.

11. The process of claim 1, further comprising:
    applying an initial voltage signal across the capacitor to test the device, the initial voltage signal having a predetermined input amplitude;
    capturing a voltage response from the device;
    comparing the voltage response to an expected response; and
    if the voltage response does not match the expected response, adjusting one or more voltage parameters in an automatic testing system coupled to the probe card contacts, wherein the one or more voltage parameters are adjusted until the voltage response matches the expected response or the device fails the test;
    wherein the device has an input buffer and an output buffer, the input buffer having a voltage input high parameter and the output buffer having a voltage output high parameter.

12. The process of claim 11, wherein the device complies with the JTAG IEEE 1149.1 standard.

13. The process of claim 12, wherein the step of capturing the voltage response from the device includes reading the voltage received at plurality of solder bumps on the device through a serial JTAG output pin.

14. The process of claim 12, further comprising providing a test signal to the device through a serial JTAG input pin, the signal causing the device to output the test signal through the output buffer of the device.

15. The process of claim 11, further comprising:
    setting one or more of the following voltage parameters:
    a maximum voltage output high amplitude for a voltage output high parameter ($VOH_{ATE}$) of an output buffer of the automatic test system coupled to the plurality of probe card contacts;
    a minimum voltage input high amplitude for a voltage input high parameter ($VIH_{ATE}$) of an input buffer of the automatic test system coupled to the plurality of probe card contacts;
    a maximum device supply voltage amplitude for a supply voltage of the output buffer of the device ($VOH_{DUT}$); and
    a minimum device supply voltage amplitude for a supply voltage of the input buffer of the device ($VIH_{DUT}$).

16. The process of claim 15, wherein $VOH_{ATE}$ causes the voltage signal input through the probe card contact to one or more of the plurality of solder bumps to rise to a level that satisfies the following relationship:

$$VOH_{ATE} \geq VIH_{DUT}*[1+(C_{DUT}/C_I)],$$

wherein $C_{DUT}$ is a device capacitance, and $C_I$ is the capacitance of the capacitor formed between the metal probe card contact, the dielectric contaminant and the solder bumps within the subset.

17. The process of claim 15, wherein $VOH_{DUT}$ causes the voltage signal output through one or more of the plurality of solder bumps to the input buffer of the automatic test system to rise to a level that satisfies the following relationship:

$$VOH_{DUT} \geq VIH_{ATE}*[1+(C_{ATE}/C_I)],$$

wherein $C_{ATE}$ is an automatic test system capacitance, and $C_I$ is the capacitance of the capacitor formed between the metal probe card contact, the dielectric contaminant and the solder bumps within the subset.

18. The process of claim 15, wherein the step of adjusting one or more voltage parameters includes changing one or more of the following:
   $VOH_{ATE}$ to the maximum voltage output high amplitude for the output buffer of the automatic test system;
   $VIH_{ATE}$ to the minimum voltage input high amplitude for the output buffer of the automatic test system;
   $VOH_{DUT}$ to the maximum device supply voltage amplitude; and
   $VIH_{DUT}$ to the minimum device supply voltage amplitude.

19. The process of claim 18, wherein, if after changing one or more of $VOH_{ATE}$, $VIH_{ATE}$, $VOH_{DUT}$ and $VIH_{DUT}$ the voltage response does not match the expected response, the device fails the test.

20. The process of claim 18, further comprising optimizing one or more of the voltage parameters if, after changing one or more of $VOH_{ATE}$, $VIH_{ATE}$, $VOH_{DUT}$ and $VIH_{DUT}$, the voltage response matches the expected response.

21. The process of claim 20, wherein the normal voltage amplitude for $VOH_{DUT}$ and normal voltage amplitude for $VOH_{ATE}$ is less than about 5 volts.

22. The process of claim 20, wherein the maximum voltage output high amplitude for $VOH_{ATE}$ is less than about 50% above the normal voltage amplitude of the voltage output high parameter of $VOH_{ATE}$.

23. The process of claim 20, wherein the maximum device supply voltage amplitude for $VOH_{DUT}$ is less than about 50% above the normal voltage amplitude for $VOH_{DUT}$.

24. The process of claim 20, wherein the minimum voltage amplitude for $VIH_{DUT}$ and the minimum voltage amplitude for $VIH_{ATE}$ is less than about 3 volts.

25. A process of testing an electronic device having one or more solder bumps that are in physical contact with one or more of a plurality of metal probe card contacts, wherein a subset of the plurality of solder bumps include a dielectric layer covering a portion of a surface of said subset of solder bumps such that a capacitor is formed by the metal probe card contact, the dielectric layer and the solder bumps within the subset, comprising:
   applying an initial voltage signal across the capacitor to test the device, the initial voltage signal having a predetermined input amplitude;
   capturing a voltage response from the device;
   comparing the voltage response to an expected response; and
   if the voltage response does not match the expected response, adjusting one or more voltage parameters in an automatic testing system coupled to the probe card contacts, wherein the one or more voltage parameters are adjusted until the voltage response matches the expected response or the device fails the test.

26. A process of testing an electronic device having one or more solder bumps that are in physical contact with one or more of a plurality of metal probe card contacts, wherein a subset of the plurality of solder bumps include a dielectric layer covering a portion of a surface of said subset of solder bumps such that a capacitor is formed by the metal probe card contact, the dielectric layer and the solder bumps within the subset, comprising:
   testing the device a first time using one or more test parameter voltages, each test parameter voltage being set at an initial value, wherein testing includes sending a test voltage signal across the capacitor, receiving a response voltage signal from the device and comparing the response voltage signal to an expected voltage signal;
   if the response voltage signal from the first test does not match the expected voltage signal, changing at least one test parameter voltage to a predetermined value and testing the device a second time using the predetermined value, wherein there is a difference between the initial value and the predetermined value of the at least one test parameter voltage; and
   if the response voltage signal for the second testing step matches the expected voltage signal, optimizing the at least one test parameter voltage.

27. The process of claim 26, wherein optimizing includes:
   altering the predetermined value of the at least one test parameter voltage to reduce the difference between the predetermined value and the initial value for the at least one test parameter voltage; and
   testing the device a third time to determine if the response voltage signal for the third testing step matches the expected voltage signal.

28. The process of claim 27, further comprising repeating the steps of altering the predetermined value and testing the device such that the predetermined value for the at least one test parameter voltage is altered by a preset voltage value and the device is tested until the response voltage signal does not match the expected response.

29. The process of claim 28, further comprising setting an optimum value for the at least one test parameter voltage at a voltage amplitude above the predetermined value at which the response voltage signal does not match the expected response.

30. A process of testing an electronic device having a plurality of solder bumps, comprising:
   moving the device in a first direction such that the device is overdriven in the first direction a pre-defined distance in the range between about 5 micrometers and 250 micrometers beyond the point in the first direction where an initial physical contact is made between a subset of said plurality of probe card contacts and a subset of said plurality of solder bumps, wherein a subset of the plurality of solder bumps include a dielectric layer covering a portion of a surface of said subset of solder bumps such that at least one capacitor is formed by one of the metal probe card contacts, the dielectric layer and one of the solder bumps within the subset; and
   testing the device by sending a voltage signal across the capacitor.

31. The process of claim 30, further comprising:
   applying an initial voltage signal across the capacitor to test the device, the initial voltage signal having a predetermined input amplitude;

capturing a voltage response from the device;
comparing the voltage response to an expected response; and if the voltage response does not match the expected response, adjusting one or more voltage parameters in an automatic testing system coupled to the probe card contacts, wherein the one or more voltage parameters are adjusted until the voltage response matches the expected response or the device fails the test;

wherein the device has an input buffer and an output buffer, the input buffer having a voltage input high parameter and the output buffer having a voltage output high parameter.

32. The process of claim 31, wherein the device complies with the JTAG IEEE 1149.1 standard.

33. The process of claim 32, wherein the step of capturing the voltage response from the device includes reading the voltage received at plurality of solder bumps on the device through a serial JTAG output pin.

34. The process of claim 32, further comprising providing a test signal to the device through a serial JTAG input pin, the signal causing the device to output the test signal through the output buffer of the device.

35. The process of claim 31, further comprising:
setting one or more of the following voltage parameters:
a maximum voltage output high amplitude for a voltage output high parameter ($VOH_{ATE}$) of an output buffer of the automatic test system coupled to the plurality of probe card contacts;
a minimum voltage input high amplitude for a voltage input high parameter ($VIH_{ATE}$) of an input buffer of the automatic test system coupled to the plurality of probe card contacts;
a maximum device supply voltage amplitude for a supply voltage of the output buffer of the device ($VOH_{DUT}$); and
a minimum device supply voltage amplitude for a supply voltage of the input buffer of the device ($VIH_{DUT}$).

36. The process of claim 35, wherein $VOH_{ATE}$ causes the voltage signal input through the probe card contact to one or more of the plurality of solder bumps to rise to a level that satisfies the following relationship:

$$VOH_{ATE} \geq VIH_{DUT}*[1+(C_{DUT}/C_I)],$$

wherein $C_{DUT}$ is a device capacitance, and $C_I$ is the capacitance of the capacitor formed between the metal probe card contact, the dielectric contaminant and the solder bumps within the subset.

37. The process of claim 35, wherein $VOH_{DUT}$ causes the voltage signal output through one or more of the plurality of solder bumps to the input buffer of the automatic test system to rise to a level that satisfies the following relationship:

$$VOH_{DUT} \geq VIH_{ATE}*[1+(C_{ATE}/C_I)],$$

wherein $C_{ATE}$ is an automatic test system capacitance, and $C_I$ is the capacitance of the capacitor formed between the metal probe card contact, the dielectric contaminant and the solder bumps within the subset.

38. The process of claim 35, wherein the step of adjusting one or more voltage parameters includes changing one or more of the following:
$VOH_{ATE}$ to the maximum voltage output high amplitude for the output buffer of the automatic test system;
$VIH_{ATE}$ to the minimum voltage input high amplitude for the output buffer of the automatic test system;
$VOH_{DUT}$ to the maximum device supply voltage amplitude; and
$VIH_{DUT}$ to the minimum device supply voltage amplitude.

39. The process of claim 38, wherein, if after changing one or more of $VOH_{ATE}$, $VIH_{ATE}$, $VOH_{DUT}$ and $VIH_{DUT}$ the voltage response does not match the expected response, the device fails the test.

40. The process of claim 38, further comprising optimizing one or more of the voltage parameters if, after changing one or more of $VOH_{ATE}$, $VIH_{ATE}$, $VOH_{DUT}$ and $VIH_{DUT}$, the voltage response matches the expected response.

41. The process of claim 40, wherein the normal voltage amplitude for $VOH_{DUT}$ and normal voltage amplitude for $VOH_{ATE}$ is less than about 5 volts.

42. The process of claim 40, wherein the maximum voltage output high amplitude for $VOH_{ATE}$ is less than about 50% above the normal voltage amplitude of the voltage output high parameter of $VOH_{ATE}$.

43. The process of claim 40, wherein the maximum device supply voltage amplitude for $VOH_{DUT}$ is less than about 50% above the normal voltage amplitude for $VOH_{DUT}$.

44. The process of claim 40, wherein the minimum voltage amplitude for $VIH_{DUT}$ and the minimum voltage amplitude for $VIH_{ATE}$ is less than about 3 volts.

45. A process of testing a CMOS electronic device having a plurality of solder bumps, comprising:
moving the device in a first direction such that physical contact is made between one or more of said plurality of solder bumps and one or more of a plurality of metal probe card contacts, wherein a subset of the plurality of solder bumps include a dielectric layer covering a portion of a surface of said subset of solder bumps such that at least one capacitor is formed by one of the metal probe card contacts, the dielectric layer and one of the solder bumps within the subset; and
testing the device by sending a voltage signal across the capacitor, wherein
an input buffer and an output buffer of the CMOS device have voltage input high parameters and voltage output high parameters, respectively, that are set in response to a supply voltage applied to the CMOS device.

* * * * *